United States Patent
Li et al.

(10) Patent No.: US 8,711,625 B2
(45) Date of Patent: Apr. 29, 2014

(54) BAD COLUMN MANAGEMENT WITH BIT INFORMATION IN NON-VOLATILE MEMORY SYSTEMS

(75) Inventors: Yan Li, Milpitas, CA (US); Kwang-Ho Kim, Pleasanton, CA (US); Frank W. Tsai, Mountain View, CA (US); Aldo Bottelli, Redwood City, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/293,494

(22) Filed: Nov. 10, 2011

(65) Prior Publication Data

US 2012/0297245 A1 Nov. 22, 2012

Related U.S. Application Data

(62) Division of application No. 12/498,220, filed on Jul. 6, 2009, now abandoned.

(51) Int. Cl.
*G11C 16/06* (2006.01)
(52) U.S. Cl.
USPC ...................... 365/185.09; 365/200
(58) Field of Classification Search
USPC ............................................ 365/185.09, 200
See application file for complete search history.

(56) References Cited

U.S. PATENT DOCUMENTS

| | | |
|---|---|---|
| 3,710,348 A | 1/1973 | Craft |
| 3,895,360 A | 7/1975 | Cricchi et al. |
| 4,357,685 A | 11/1982 | Daniele et al. |
| 4,426,688 A | 1/1984 | Moxley |
| 4,720,815 A | 1/1988 | Ogawa |
| 4,757,477 A | 7/1988 | Nagayama et al. |
| 5,070,032 A | 12/1991 | Yuan et al. |
| 5,095,344 A | 3/1992 | Harari |
| 5,172,338 A | 12/1992 | Mehrotra et al. |
| 5,200,959 A | 4/1993 | Gross et al. |
| 5,270,979 A | 12/1993 | Harari et al. |
| 5,313,421 A | 5/1994 | Guterman et al. |
| 5,315,541 A | 5/1994 | Harari et al. |

(Continued)

FOREIGN PATENT DOCUMENTS

| | | |
|---|---|---|
| CN | 1549133 | 11/2004 |
| JP | 61292747 A | 12/1986 |

(Continued)

OTHER PUBLICATIONS

"Numonyx Sector-Based Compact File System (SCFS) Software is a Feature-Rich Flash Solution," *Numonyx*, Nov. 3, 2009, 2 pages.

(Continued)

*Primary Examiner* — Anthan Tran
(74) *Attorney, Agent, or Firm* — Davis Wright Tremaine LLP

(57) ABSTRACT

Column based defect management techniques are presented. Each column of the memory has an associated isolation latch or register whose value indicates whether the column is defective, but in addition to this information, for columns marked as defective, additional information is used to indicate whether the column as a whole is to be treated as defective, or whether just individual bits of the column are defective. The defective elements can then be re-mapped to a redundant element at either the appropriate bit or column level based on the data. When a column is bad, but only on the bit level, the good bits can still be used for data.

9 Claims, 24 Drawing Sheets

(56) References Cited

U.S. PATENT DOCUMENTS

| | | |
|---|---|---|
| 5,343,063 A | 8/1994 | Yuan et al. |
| 5,380,672 A | 1/1995 | Yuan et al. |
| 5,386,390 A | 1/1995 | Okitaka |
| 5,418,752 A | 5/1995 | Harari et al. |
| 5,428,621 A | 6/1995 | Mehrotra et al. |
| 5,430,679 A | 7/1995 | Hiltebeitel et al. |
| 5,430,859 A | 7/1995 | Norman et al. |
| 5,442,748 A | 8/1995 | Chang et al. |
| 5,479,370 A | 12/1995 | Furuyama et al. |
| 5,485,425 A | 1/1996 | Iwai et al. |
| 5,570,315 A | 10/1996 | Tanaka et al. |
| 5,595,924 A | 1/1997 | Yuan et al. |
| 5,602,987 A | 2/1997 | Harari et al. |
| 5,642,312 A | 6/1997 | Harari |
| 5,657,332 A | 8/1997 | Auclair et al. |
| 5,661,053 A | 8/1997 | Yuan |
| 5,663,901 A | 9/1997 | Wallace et al. |
| 5,699,300 A | 12/1997 | Akamatsu et al. |
| 5,712,180 A | 1/1998 | Guterman et al. |
| 5,768,192 A | 6/1998 | Eitan |
| 5,774,397 A | 6/1998 | Endoh et al. |
| 5,783,958 A | 7/1998 | Lysinger |
| 5,822,245 A | 10/1998 | Gupta et al. |
| 5,848,009 A | 12/1998 | Lee et al. |
| 5,862,080 A | 1/1999 | Harari et al. |
| 5,890,192 A | 3/1999 | Lee et al. |
| 5,903,495 A | 5/1999 | Takeuchi et al. |
| 5,930,167 A | 7/1999 | Lee |
| 5,936,971 A | 8/1999 | Harari et al. |
| 6,011,725 A | 1/2000 | Eitan |
| 6,021,463 A | 2/2000 | Belser |
| 6,038,167 A | 3/2000 | Miwa et al. |
| 6,038,184 A | 3/2000 | Naritake |
| 6,046,935 A | 4/2000 | Takeuchi et al. |
| 6,091,666 A | 7/2000 | Arase et al. |
| 6,134,148 A | 10/2000 | Kawahara et al. |
| 6,151,248 A | 11/2000 | Harari et al. |
| 6,222,762 B1 | 4/2001 | Guterman et al. |
| 6,230,233 B1 | 5/2001 | Lofgren et al. |
| 6,252,800 B1 | 6/2001 | Chida |
| 6,266,273 B1 | 7/2001 | Conley et al. |
| 6,282,624 B1 | 8/2001 | Kimura et al. |
| 6,353,553 B1 | 3/2002 | Tamada et al. |
| 6,426,893 B1 | 7/2002 | Conley et al. |
| 6,456,528 B1 | 9/2002 | Chen |
| 6,480,423 B2 | 11/2002 | Toda et al. |
| 6,510,488 B2 | 1/2003 | Lasser |
| 6,512,263 B1 | 1/2003 | Yuan et al. |
| 6,522,580 B2 | 2/2003 | Chen et al. |
| 6,523,132 B1 | 2/2003 | Harari et al. |
| 6,560,146 B2 | 5/2003 | Cernea |
| 6,581,142 B1 | 6/2003 | Jacobs |
| 6,594,177 B2 | 7/2003 | Matarrese et al. |
| 6,657,891 B1 | 12/2003 | Shibata et al. |
| 6,771,536 B2 | 8/2004 | Li et al. |
| 6,813,184 B2 | 11/2004 | Lee |
| 6,853,596 B2 | 2/2005 | Cheung |
| 6,870,768 B2 | 3/2005 | Cernea et al. |
| 6,967,873 B2 | 11/2005 | Hamilton et al. |
| 6,990,018 B2 | 1/2006 | Tanaka et al. |
| 6,996,017 B2 | 2/2006 | Scheuerlein et al. |
| 7,027,330 B2 | 4/2006 | Park |
| 7,039,781 B2 | 5/2006 | Iwata et al. |
| 7,057,939 B2 | 6/2006 | Li et al. |
| 7,058,818 B2 | 6/2006 | Dariel |
| 7,076,611 B2 | 7/2006 | Steere et al. |
| 7,110,294 B2 | 9/2006 | Kawai |
| 7,158,421 B2 | 1/2007 | Li et al. |
| 7,170,802 B2 | 1/2007 | Cernea et al. |
| 7,206,230 B2 | 4/2007 | Li et al. |
| 7,224,605 B1 | 5/2007 | Moogat |
| 7,257,689 B1 | 8/2007 | Baird |
| 7,299,314 B2 | 11/2007 | Lin et al. |
| 7,310,347 B2 | 12/2007 | Lasser |
| 7,345,928 B2 | 3/2008 | Li |
| 7,405,985 B2 | 7/2008 | Cernea et al. |
| 7,411,846 B2 | 8/2008 | Terzioglu |
| 7,420,847 B2 | 9/2008 | Li |
| 7,426,623 B2 | 9/2008 | Lasser |
| 7,447,070 B2 | 11/2008 | Cernea |
| 7,490,283 B2 | 2/2009 | Gorobets et al. |
| 7,493,457 B2 | 2/2009 | Murin |
| 7,502,254 B2 | 3/2009 | Murin et al. |
| 7,502,259 B2 | 3/2009 | Gorobets |
| 8,144,512 B2 | 3/2012 | Huang et al. |
| 2001/0000023 A1 | 3/2001 | Kawahara et al. |
| 2002/0118574 A1 | 8/2002 | Gongwer et al. |
| 2003/0021169 A1* | 1/2003 | Beer et al. ............. 365/200 |
| 2003/0182317 A1 | 9/2003 | Kahn et al. |
| 2003/0223274 A1 | 12/2003 | Cernea |
| 2004/0060031 A1 | 3/2004 | Cernea |
| 2004/0109357 A1 | 6/2004 | Cernea et al. |
| 2005/0073884 A1 | 4/2005 | Gonzalez et al. |
| 2005/0141387 A1 | 6/2005 | Cernea et al. |
| 2005/0144360 A1 | 6/2005 | Bennett et al. |
| 2005/0144365 A1 | 6/2005 | Gorobets et al. |
| 2005/0213393 A1 | 9/2005 | Lasser |
| 2006/0126390 A1 | 6/2006 | Gorobets |
| 2006/0136656 A1 | 6/2006 | Conley et al. |
| 2006/0161728 A1 | 7/2006 | Bennett et al. |
| 2006/0256631 A1* | 11/2006 | Nobunaga et al. ............. 365/201 |
| 2007/0061502 A1 | 3/2007 | Lasser |
| 2007/0065119 A1 | 3/2007 | Pomerantz |
| 2007/0091677 A1 | 4/2007 | Lasser et al. |
| 2007/0103977 A1 | 5/2007 | Conley et al. |
| 2007/0159652 A1 | 7/2007 | Sato |
| 2007/0180346 A1 | 8/2007 | Murin |
| 2007/0186032 A1 | 8/2007 | Sinclair et al. |
| 2007/0211530 A1 | 9/2007 | Nakano |
| 2007/0220197 A1 | 9/2007 | Lasser |
| 2007/0237006 A1 | 10/2007 | Murin et al. |
| 2007/0260808 A1 | 11/2007 | Raines et al. |
| 2007/0268745 A1 | 11/2007 | Lasser |
| 2007/0283081 A1 | 12/2007 | Lasser |
| 2007/0285980 A1 | 12/2007 | Shimizu et al. |
| 2008/0104309 A1 | 5/2008 | Cheon et al. |
| 2008/0104312 A1 | 5/2008 | Lasser |
| 2008/0147996 A1 | 6/2008 | Jenkins et al. |
| 2008/0159012 A1 | 7/2008 | Kim |
| 2008/0181000 A1 | 7/2008 | Lasser |
| 2008/0209112 A1 | 8/2008 | Yu et al. |
| 2008/0244338 A1 | 10/2008 | Mokhlesi et al. |
| 2008/0244367 A1 | 10/2008 | Chin et al. |
| 2008/0250220 A1 | 10/2008 | Ito |
| 2008/0250300 A1 | 10/2008 | Mokhlesi et al. |
| 2008/0279005 A1 | 11/2008 | France |
| 2008/0294814 A1 | 11/2008 | Gorobets |
| 2008/0301532 A1 | 12/2008 | Uchikawa et al. |
| 2008/0310224 A1 | 12/2008 | Roohparvar et al. |
| 2009/0067244 A1 | 3/2009 | Li et al. |
| 2009/0089481 A1 | 4/2009 | Kapoor et al. |
| 2009/0089520 A1 | 4/2009 | Saha et al. |
| 2009/0094482 A1 | 4/2009 | Zilberman |
| 2009/0172247 A1 | 7/2009 | Bar-Or et al. |
| 2009/0172498 A1 | 7/2009 | Schlick et al. |
| 2009/0303814 A1* | 12/2009 | Fekih-Romdhane ......... 365/200 |
| 2009/0310408 A1 | 12/2009 | Lee et al. |
| 2010/0107004 A1 | 4/2010 | Bottelli et al. |
| 2010/0157641 A1 | 6/2010 | Shalvi et al. |
| 2010/0172179 A1 | 7/2010 | Gorobets et al. |
| 2010/0172180 A1 | 7/2010 | Paley et al. |
| 2010/0174845 A1 | 7/2010 | Gorobets et al. |
| 2010/0174846 A1 | 7/2010 | Paley et al. |
| 2010/0174847 A1 | 7/2010 | Paley et al. |
| 2010/0287217 A1 | 11/2010 | Borchers et al. |
| 2010/0325351 A1 | 12/2010 | Bennett |
| 2010/0329007 A1 | 12/2010 | Chibvongodze et al. |
| 2011/0063909 A1 | 3/2011 | Komatsu |
| 2011/0096601 A1 | 4/2011 | Gavens et al. |
| 2011/0099460 A1 | 4/2011 | Dusija et al. |
| 2011/0153913 A1 | 6/2011 | Huang et al. |

(56) References Cited

U.S. PATENT DOCUMENTS

FOREIGN PATENT DOCUMENTS

| | | |
|---|---|---|
| JP | 1128297 | 5/1989 |
| JP | 01128297 | 5/1989 |
| JP | 06150666 A | 5/1994 |
| WO | WO 98/44420 | 10/1998 |
| WO | WO 00/49488 | 8/2000 |
| WO | WO 03/025939 A2 | 3/2003 |
| WO | WO 2006/064318 | 6/2006 |
| WO | WO 2007/141783 | 12/2007 |

OTHER PUBLICATIONS

Choudhuri et al., "Performance Improvement of Block Based NAND Flash. Translation Layer," CODES + ISSS '07, Salzburg, Austria, Sep. 2007, pp. 257-262.

Chang et al., "Real-Time Garbage Collection for Flash-Memory Storage Systems of Real-Time Embedded Systems," Nov. 2004, ACM, ACM Transactions on Embedded Computing Systems, vol. 3, pp. 837-863.

Lee et al., "Block Recycling Schemes and Their Cost-Based Optimization in NAND Flash Memory Based Storage System," Oct. 2007, ACM., EMSOFT '07, pp. 174-182.

Kang et al., "A Superblock-Based Flash Translation Layer for NAND Flash Memory," EMSOFT'06, Oct. 2006, pp. 161-170.

Im et al., "Storage Architecture and Software Support for SLC/MLC Combined Flash Memory," Mar. 2009, ACM, SAC'09, pp. 1664-1669.

Notification Concerning Transmittal of International Preliminary Report for Int'l Application No. PCT/US2010/040828 dated Jan. 19, 2012, 16 pages.

"Numonyx Sector-Based Compact File System (SCFS) Software is a Feature-Rich Flash Solution," Numonyx, 2009, 2 pages.

"SanDisk, Toshiba Develop 32-Nanometer NAND Flash Technology," SanDisk Corporation and Toshiba Corporation, Feb. 11, 2009, www.physorg.com/news153597019.html, 9 pages.

Choudhuri et al., "Performance Improvement of Block Based NAND Flash Translation Layer," CODES + ISSS '07, Salzburg, Austria, pp. 257-262.

Communication Relating to the Results of the Partial International Search, International Appl. No. PCT/US2010/040828 mailed Oct. 20, 2010, 1 page.

Eitan et al., "NROM: A Novel Localized Trapping, 2-Bit Nonvolatile Memory Cell," *IEEE Electron Device Letters*, vol. 21, No. 11, Nov. 2000, pp. 543-545.

Notification of Transmittal of the International Search Report and then Written Opinion of the International Searching Authority, or the Declaration for International Application No. PCT/US2010/040828 dated Jan. 10, 2011, 18 pages.

U.S. Office Action for U.S. Appl. No. 12/498,220 mailed Jun. 10, 2011, 17 pages.

U.S. Appl. No. 11/026,536 entitled "Non-Volatile Memory and Method with Shared Processing for an Aggregate of Read/Write Circuits," filed Dec. 29, 2004, 50 pages.

U.S. Appl. No. 12/051,462 entitled "Adaptive Algorithm in Cache Operation with Dynamic Data Latch Requirements," filed Mar. 19, 2008, 20 pages.

U.S. Appl. No. 12/051,492 entitled "Different Combinations of Wordline Order and Look-Ahead Read to Improve Flash Memory Performance," filed Mar. 19, 2008, 20 pages.

U.S. Appl. No. 12/348,819 entitled "Wear Leveling for Non-Volatile Memories: Maintenance of Experience Count and Passive Techniques," filed Jan. 5, 2009, 73 pages.

U.S. Appl. No. 12/348,825 entitled "Spare Block Management in Non-Volatile Memories," filed Jan. 5, 2009, 76 pages.

U.S. Appl. No. 12/348,891 entitled "Non-Volatile Memory and Method With Write Cache Partitioning," filed Jan. 5, 2009, 151 pages.

U.S. Appl. No. 12/348,895 entitled "Nonvolatile Memory With Write Cache Having Flush/Eviction Methods," filed Jan. 5, 2009, 151 pages.

U.S. Appl. No. 12/348,899 entitled "Non-Volatile Memory and Method With Write Cache Partition Management Methods," filed Jan. 5, 2009, 149 pages.

U.S. Appl. No. 12/478,997 entitled "Folding Data Stored in Binary Format into Multi-State Format Within Non-Volatile Devices," filed Jun. 5, 2009, 52 pages.

U.S. Appl. No. 12/642,740 entitled "Atomic Program Sequence and Write Abort Detection," filed Dec. 18, 2009, 60 pages.

U.S. Appl. No. 61/142,620 entitled "Non-Volatile Memory and Method With Improved Block Management System," filed Jan. 5, 2009, 144 pages.

Raz et al., "Implementing MLC NAND Flash for Cost-Effective, High-Capacity Memory," Sep. 2003., M-Systems, 13 pages.

U.S. Office Action for U.S. Appl. No. 12/498,220 mailed Oct. 29, 2010, 25 pages.

\* cited by examiner

Input Logic Truth Table

| Transfer Mode | ONE | ONEB<0> | ONEB<1> | PBus (Input) | BSI (Output) |
|---|---|---|---|---|---|
| Pass-Through | 1 | 0 | 0 | PBus | PBus |
| Invert | 0 | 1 | 1 | PBus | PBus* |
| Float | 1 | 1 | 0 | PBus | Float |

Output Logic Truth Table

| Transfer Mode | PINV | NINV | PDIR | NDIR | MTCH | PBus (Output) |
|---|---|---|---|---|---|---|
| Pass-Through | D | D | D | 1 | 0 | 0 |
|  | 0 | D | D | D | 1 | 1 |
| Invert | D | D | 0 | D | 0 | 1 |
|  | D | 1 | D | D | 1 | 0 |
| Float | D | D | D | D | X | Z |
| Pre-Charge | 0 | D | 0 | D | X | 1 |

(Default Values: PINV=1, NINV=0, PDIR=1, NDIR=0)

| | Flag1 | Flag0 | Byte (AA[1]) | IO7 | IO6 | IO5 | IO4 | IO3 | IO2 | IO1 | IO0 |
|---|---|---|---|---|---|---|---|---|---|---|---|
| Unused Column | 0 | 0 | Low | 1 | 1 | 1 | 1 | 1 | 1 | 1 | 1 |
| | | | High | Flag1 | Flag0 | 1 | 1 | 1 | 1 | 1 | 1 |
| Used Column | 0 | 1 | Low | 1 | A[7] | A[6] | A[5] | A[4] | A[3] | A[2] | A[1] |
| | | | High | Flag1 | Flag0 | A[13] | A[12] | A[11] | A[10] | A[9] | A[8] |
| Bad RD Column | 1 | 1 | Low | 1 | 1 | 1 | 1 | 1 | 1 | 1 | 1 |
| | | | High | Flag1 | Flag0 | 1 | 1 | 1 | 1 | 1 | 1 |
| | 1 | 0 | Illegal Case ||||||||

*FIG. 13*

| | Flag1 | Flag0 | Byte (AA[1]) | IO7 | IO6 | IO5 | IO4 | IO3 | IO2 | IO1 | IO0 |
|---|---|---|---|---|---|---|---|---|---|---|---|
| Unused Column | 0 | 0 | Low | 1 | 1 | 1 | 1 | 1 | 1 | 1 | 1 |
| | | | High | Flag1 | Flag0 | 1 | 1 | 1 | 1 | 1 | 1 |
| | | | Low | 1 | 1 | 1 | 1 | 1 | 1 | 1 | 1 |
| | | | High | 1 | 1 | 1 | 1 | 1 | 1 | 1 | 1 |
| Used Column (Whole Byte Failure) | 0 | 1 | Low | 1 | A[7] | A[6] | A[5] | A[4] | A[3] | A[2] | A[1] |
| | | | High | Flag1 | Flag0 | A[13] | A[12] | A[11] | A[10] | A[9] | A[8] |
| | | | Low | 0 | 0 | 0 | 0 | 0 | 0 | 0 | 0 |
| | | | High | 0 | 0 | 0 | 0 | 0 | 0 | 0 | 0 |
| Used Column (Single Bit IO6 Failure) | 0 | 1 | Low | 1 | A[7] | A[6] | A[5] | A[4] | A[3] | A[2] | A[1] |
| | | | High | Flag1 | Flag0 | A[13] | A[12] | A[11] | A[10] | A[9] | A[8] |
| | | | Low | 1 | 0 | 1 | 1 | 1 | 1 | 1 | 1 |
| | | | High | 1 | 0 | 1 | 1 | 1 | 1 | 1 | 1 |
| Bad RD Column | 1 | 1 | Low | 1 | 1 | 1 | 1 | 1 | 1 | 1 | 1 |
| | | | High | Flag1 | Flag0 | 1 | 1 | 1 | 1 | 1 | 1 |
| | | | Low | 1 | 1 | 1 | 1 | 1 | 1 | 1 | 1 |
| | | | High | 1 | 1 | 1 | 1 | 1 | 1 | 1 | 1 |
| | 1 | 0 | | colspan Illegal Case | | | | | | | |

FIG. 14A

New CRD Data Format

| | Flag | Byte (AA[1]) | IO7 | IO6 | IO5 | IO4 | IO3 | IO2 | IO1 | IO0 |
|---|---|---|---|---|---|---|---|---|---|---|
| Used Column | 0 | Low | Flag | A[7] | A[6] | A[5] | A[4] | A[3] | A[2] | A[1] |
| | | High | Mode1 | Mode0 | A[13] | A[12] | A[11] | A[10] | A[9] | A[8] |
| | | Low | 1 | 0 | 0 | 1 | 1 | 1 | 1 | 1 |
| | | High | 1 | 0 | 1 | 1 | 1 | 1 | 1 | 1 |
| Bad RD Column | 1 | Low | Flag | 1 | 1 | 1 | 1 | 1 | 1 | 1 |
| | | High | Mode1 | Mode0 | 1 | 1 | 1 | 1 | 1 | 1 |
| | | Low | x | x | x | x | x | x | x | x |
| | | High | x | x | x | x | x | x | x | x |

FIG. 14B

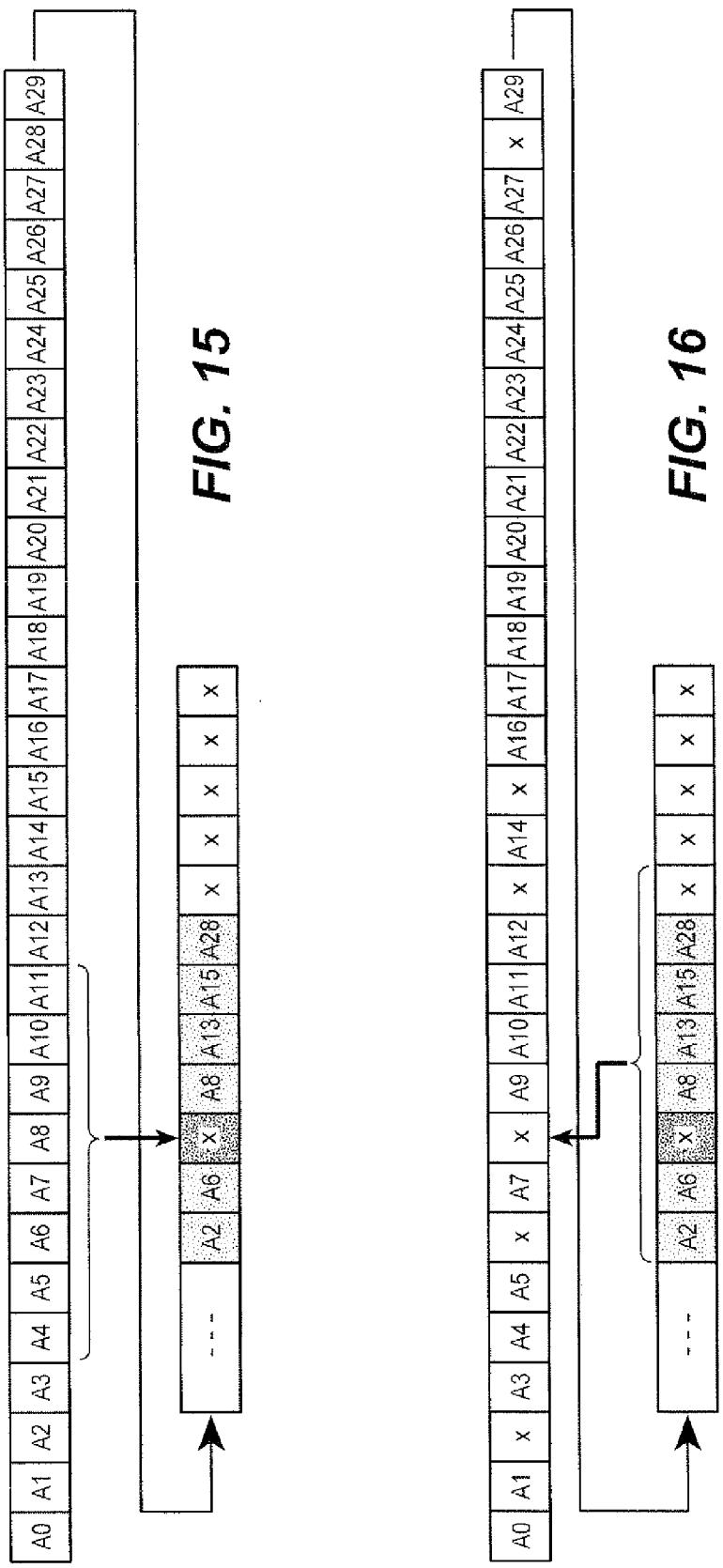

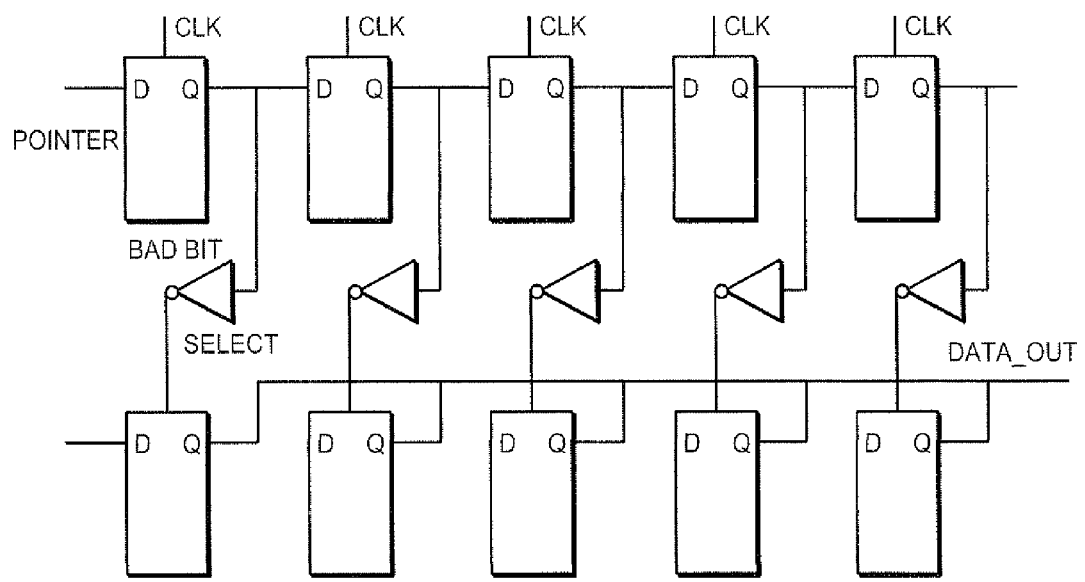
FIG. 24
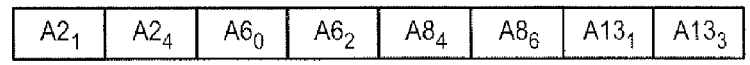
| A2₁ | A2₄ | A6₀ | A6₂ | A8₄ | A8₆ | A13₁ | A13₃ |
| A13₆ | A15₂ | | | | | | |
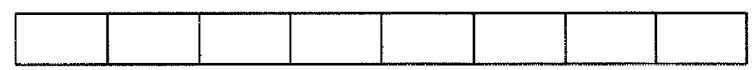
FIG. 25

| IO | Byte | Byte | Byte | ColRD | |
|---|---|---|---|---|---|
| 7 | A7 | B7 | C7 | A6 | |
| 6 | A6 | B6 | C6 | B6 | |
| 5 | A5 | B5 | C5 | B3 | |
| 4 | A4 | B4 | C4 | C0 | |
| 3 | A3 | B3 | C3 | X | |
| 2 | A2 | B2 | C2 | X | |
| 1 | A1 | B1 | C1 | X | |
| 0 | A0 | B0 | C0 | X | |

BAD COLUMN MANAGEMENT WITH BIT INFORMATION IN NON-VOLATILE MEMORY SYSTEMS

CROSS-REFERENCE TO RELATED APPLICATION

This application is a divisional of U.S. patent application Ser. No. 12/498,220 filed Jul. 6, 2009, which is incorporated in its entirety herein by this reference.

FIELD OF THE INVENTION

This invention relates generally to non-volatile semiconductor memory such as electrically erasable programmable read-only memory (EEPROM) and flash EEPROM and, more specifically, to techniques for handling defects in such memories.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

EXAMPLES OF NON-VOLATILE MEMORY CELLS

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1-left and T1-right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1-left is being accessed, both the T2 and T1-right are turned on to allow the current in the T1-left's portion of the channel to pass between the source and the drain. Similarly, when the storage unit T1-right is being accessed, T2 and T1-left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into an NAND cell. An NAND cell 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND cell via its source terminal 54 and drain terminal 56 respectively.

When an addressed memory transistor within an NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effective created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903, 495, 6,046,935.

FIG. 1E illustrates schematically a non-volatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIG. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 36 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND cells, a bit line is coupled to the drain terminal 56 of each NAND cell. Along each row of NAND cells, a source line may connect all their source terminals 54. Also the control gates of the NAND cells along a row are connected to a series of corresponding word lines. An entire row of NAND cells can be addressed by turning on the pair of select transistors (see FIG. 1D) with appropriate voltages on their control gates via the connected word lines. When a memory transistor within the chain of a NAND cell is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level. EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 µA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with. FIGS. 2 and 3, a memory transistor of a memory cell in the memory array 100 is addressable via a set of selected word line(s) and bit line(s). The row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to memory elements in the array.

FIG. 6A is a schematic block diagram of an individual read/write module 190. Essentially, during read or verify, a sense amplifier determines the current flowing through the drain of an addressed memory transistor connected via a selected bit line. The current depends on the charge stored in the memory transistor and its control gate voltage. For example, in a multi-state EEPROM cell, its floating gate can be charged to one of several different levels. For a 4-level cell, it may be used to store two bits of data. The level detected by the sense amplifier is converted by a level-to-bits conversion logic to a set of data bits to be stored in a data latch.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

Referring to FIG. 5, the read/write circuits 170 is organized into banks of read/write stacks 180. Each read/write stack 180 is a stack of read/write modules 190. In a memory array, the column spacing is determined by the size of the one or two transistors that occupy it. However, as can be seen from FIG. 6A, the circuitry of a read/write module will likely be implemented with many more transistors and circuit elements and therefore will occupy a space over many columns. In order to service more than one column among the occupied columns, multiple modules are stacked up on top of each other.

FIG. 6B shows the read/write stack of FIG. 5 implemented conventionally by a stack of read/write modules 190. For example, a read/write module may extend over sixteen columns, then a read/write stack 180 with a stack of eight read/write modules can be used to service eight columns in parallel. The read/write stack can be coupled via a column decoder to either the eight odd (1, 3, 5, 7, 9, 11, 13, 15) columns or the eight even (2, 4, 6, 8, 10, 12, 14, 16) columns among the bank.

As mentioned before, conventional memory devices improve read/write operations by operating in a massively parallel manner on all even or all odd bit lines at a time. This architecture of a row consisting of two interleaved pages will help to alleviate the problem of fitting the block of read/write circuits. It is also dictated by consideration of controlling bit-line to bit-line capacitive coupling. A block decoder is used to multiplex the set of read/write modules to either the even page or the odd page. In this way, whenever one set bit lines are being read or programmed, the interleaving set can be grounded to minimize immediate neighbor coupling.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

The problem of neighboring field coupling becomes more pronounced with ever closer spacing between memory transistors. In a memory transistor, a charge storage element is sandwiched between a channel region and a control gate. The current that flows in the channel region is a function of the resultant electric field contributed by the field at the control gate and the charge storage element. With ever increasing density, memory transistors are formed closer and closer together. The field from neighboring charge elements then becomes significant contributor to the resultant field of an affected cell. The neighboring field depends on the charge programmed into the charge storage elements of the neighbors. This perturbing field is dynamic in nature as it changes with the programmed states of the neighbors. Thus, an affected cell may read differently at different time depending on the changing states of the neighbors.

The conventional architecture of interleaving page exacerbates the error caused by neighboring floating gate coupling. Since the even page and the odd page are programmed and read independently of each other, a page may be programmed under one set of condition but read back under an entirely different set of condition, depending on what has happened to the intervening page in the meantime. The read errors will become more severe with increasing density, requiring a more accurate read operation and coarser partitioning of the threshold window for multi-state implementation. Performance will suffer and the potential capacity in a multi-state implementation is limited.

United States Patent Publication No. US-2004-0060031-A1 discloses a high performance yet compact non-volatile memory device having a large block of read/write circuits to read and write a corresponding block of memory cells in parallel. In particular, the memory device has an architecture that reduces redundancy in the block of read/write circuits to a minimum. Significant saving in space as well as power is accomplished by redistributing the block of read/write modules into a block read/write module core portions that operate in parallel while interacting with a substantially smaller sets of common portions in a time-multiplexing manner. In particular, data processing among read/write circuits between a plurality of sense amplifiers and data latches is performed by a shared processor.

Therefore there is a general need for high performance and high capacity non-volatile memory. In particular, there is a need for a compact non-volatile memory with enhanced read and program performance having an improved processor that is compact and efficient, yet highly versatile for processing data among the read/writing circuits.

SUMMARY OF INVENTION

A non-volatile memory circuit including an array of non-volatile memory cells formed along columns of multiple bits, the columns including a plurality of regular columns and one or more redundancy columns, is described. The memory circuit also includes a plurality of latches, each corresponding to one of the regular columns and having a bit whose value indicates if the corresponding column is defective. The memory circuit storing a column redundancy data table whose contents indicate for each redundancy column whether the redundancy column is being used and, for redundancy columns that are being used, a defective regular column to which it corresponds and the bits therein which are defective. The memory circuit stores data corresponding to the defective bits of defective regular columns in the redundancy column portion.

According to an additional set of aspects, a method of operating a non-volatile memory circuit is presented, where the memory circuit includes an array of non-volatile memory cells formed along columns of multiple bits and having a latch associated with each of the columns whose value indicates if the corresponding column has a defect. The method includes: performing a write operation to concurrently program a plurality of memory cells on a corresponding plurality of columns, including one or more columns having an associated latch whose value indicates the corresponding column has a defect; determining the number of the plurality of concurrently programmed memory cells that were not successfully programmed in the write operation, wherein the columns whose latch values indicate the column has a defect are not counted in the determining; and determining whether the number of cells that were not successfully been programmed during the write operation is acceptable.

According to another set of aspects, methods of operating a non-volatile memory circuit having an array of non-volatile memory cells formed along columns of multiple bits, the columns including a plurality of regular columns and one or more redundancy columns are presented. The method includes performing a plurality of column test operations to determine which columns are defective and the individual bits therein which are defective, each of the column tests including: writing and reading back an externally supplied data pattern to the columns; and comparing the externally supplied data pattern as read back with an expected data pattern, wherein said column test operation are performed by circuitry on the memory circuit and each of the column tests uses a different data pattern. The method also includes recording addresses of any of the regular columns determined defective and the individual bits therein which are determined defective in a column redundancy data table stored on the memory circuit; and, for any of the regular columns determined defective, setting a latch associated therewith to a value indicating that the associated column is defective.

In other aspects, a method of operating a non-volatile memory circuit having an array of non-volatile memory cells formed along columns of multiple bits, the columns including a plurality of regular columns and one or more redundancy columns is described. The method includes: storing on the memory circuit a column redundancy data table whose contents indicate for each redundancy column whether the redundancy column is being used and, for redundancy columns that are being used, a defective regular column to which it corresponds and the bits therein which are defective; receiving a set of data to program into the memory array; determining the elements of the set of data assigned to be programmed to defective bits of defective regular columns based upon the column redundancy circuit data table; storing the elements of the set of data determined to be assigned to be programmed to defective bits of defective columns in peripheral latch circuits on the memory circuit; storing the set of data into programming latches for the memory array; performing a programming operation into the regular columns of the memory array from the programming latches; and programming the elements of the data set stored in the peripheral latches into the redundancy columns.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 13 illustrates an example of a format for column redundancy data without bit information.

FIG. 14A illustrates an example of a format for column redundancy data including bit information.

FIG. 14B illustrates an alternate embodiment of a format for column redundancy data including bit information.

FIGS. 15 and 16 respectively give a schematic representation of bit substitution in the write and read process.

FIGS. 23 and 25 respectively illustrate a set of bad bits before and after compacting.

FIGS. 24 and 26 respectively illustrate an arrangement of latches for packing and unpacking the data corresponding to the bad bits.

DETAILED DESCRIPTION OF THE PREFERRED EMBODIMENTS

Figure 1A:
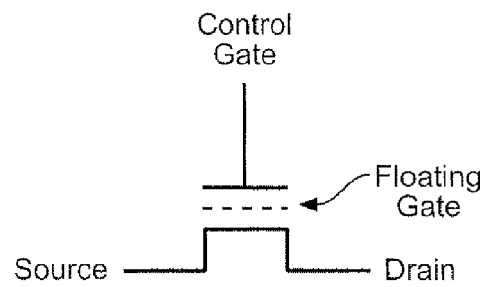
FIGS. 1A-1E illustrate schematically different examples of non-volatile memory cells.
Figure 1B:
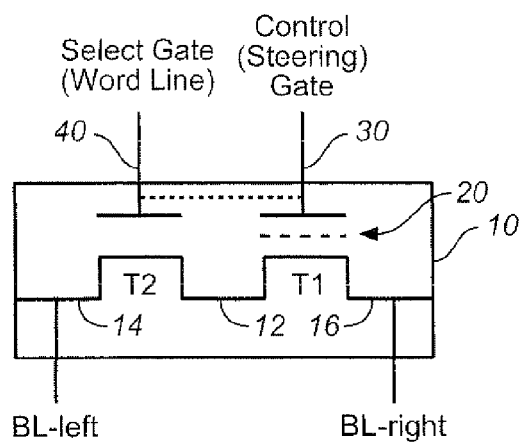
Figure 1C:
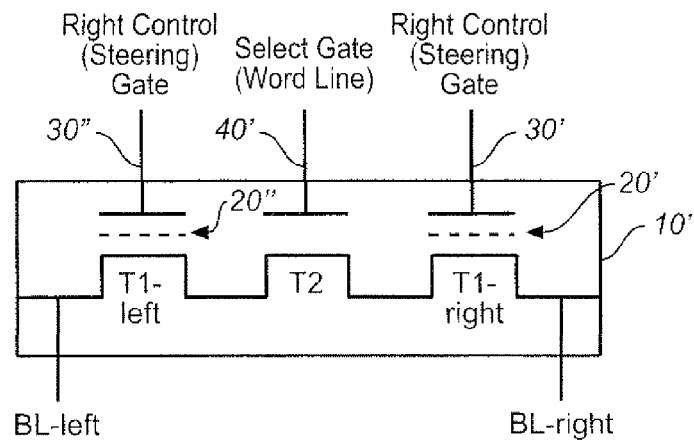
Figure 1D:
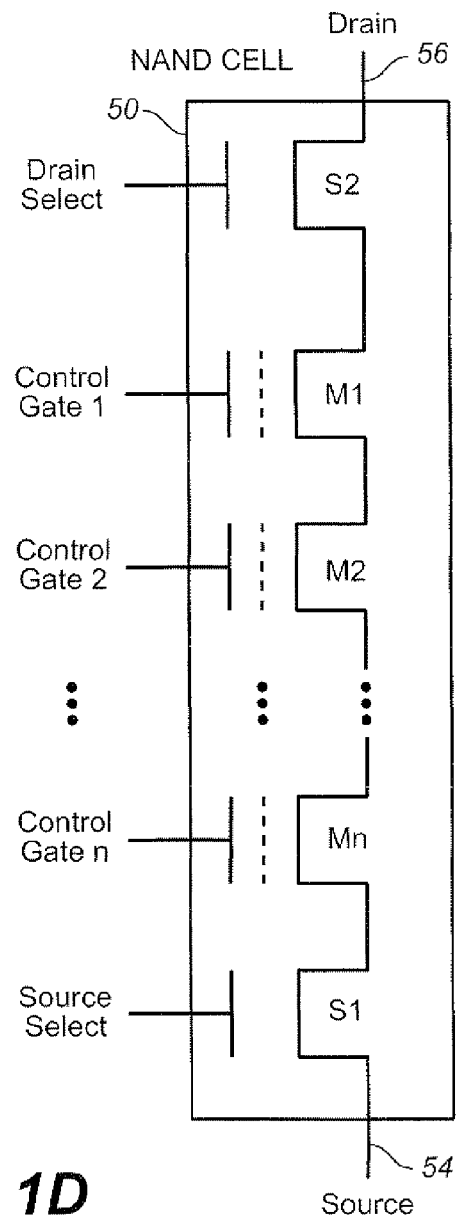
Figure 1E:
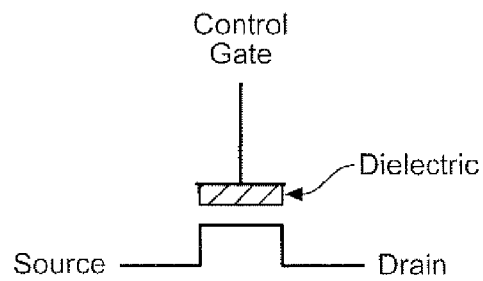
Figure 2:
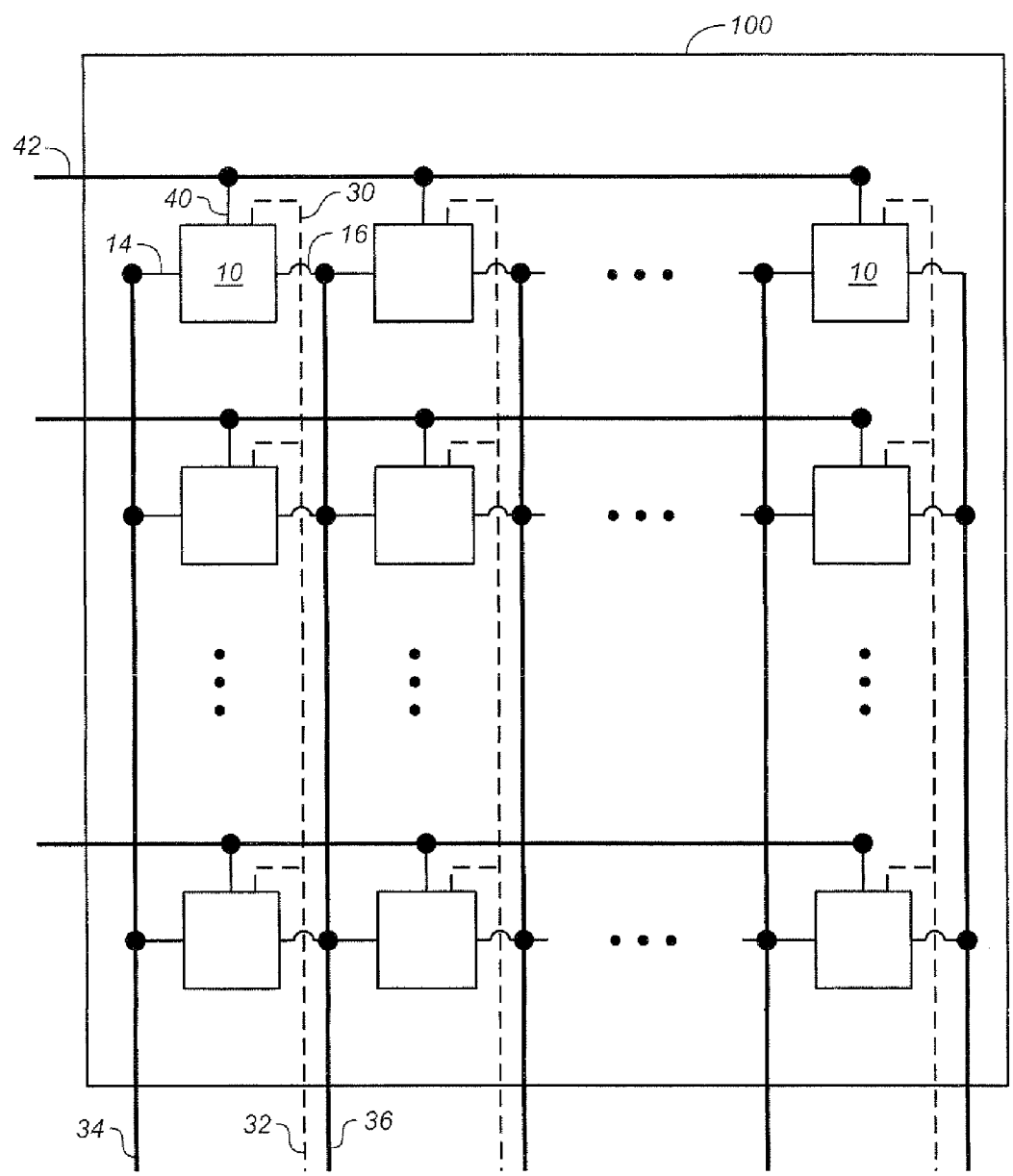
FIG. 2 illustrates an example of an NOR array of memory cells.
Figure 3:
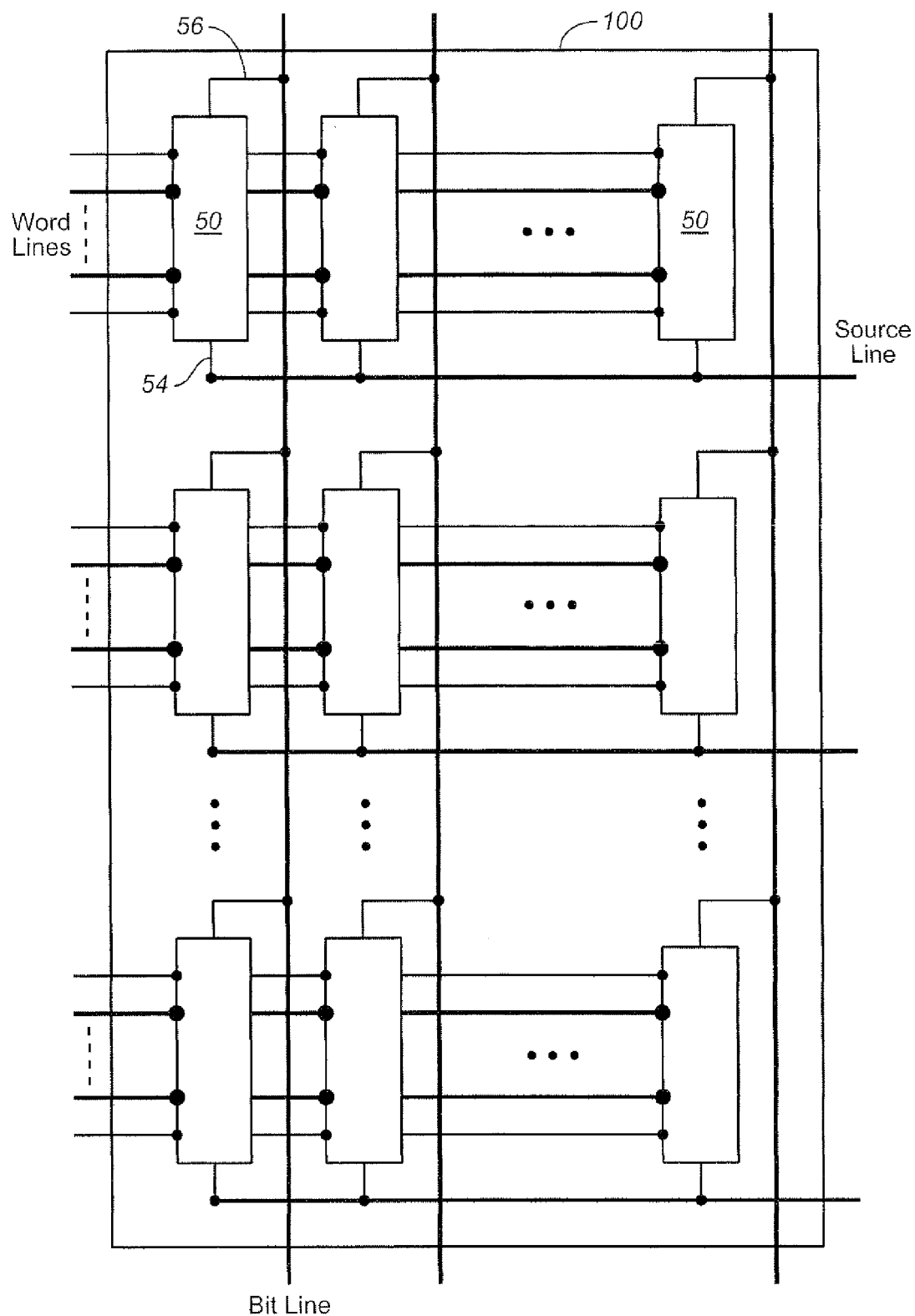
FIG. 3 illustrates an example of an NAND array of memory cells, such as that shown in FIG. 1D.
Figure 4:
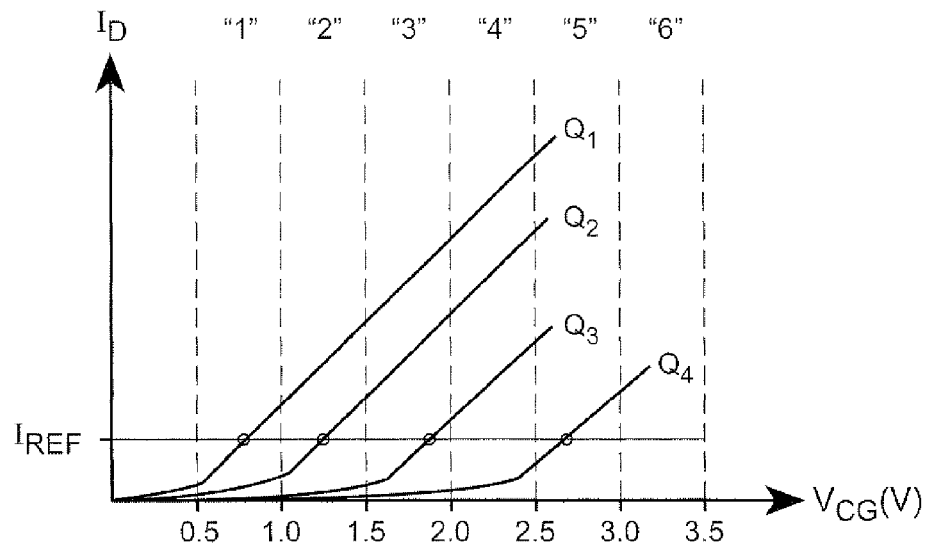
FIG. 4 illustrates the relation between the source-drain current and the control gate voltage for four different charges Q1-Q4 that the floating gate may be storing at any one time.
Figure 5:
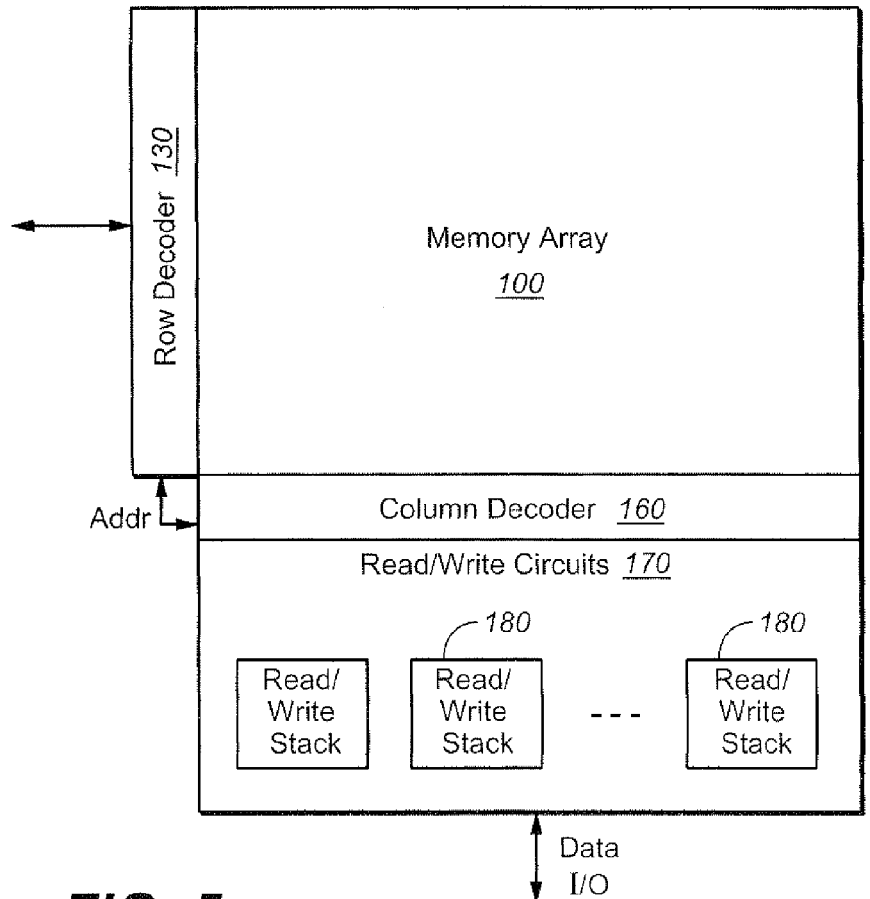
FIG. 5 illustrates schematically a typical arrangement of a memory array accessible by read/write circuits via row and column decoders.
Figure 6A:
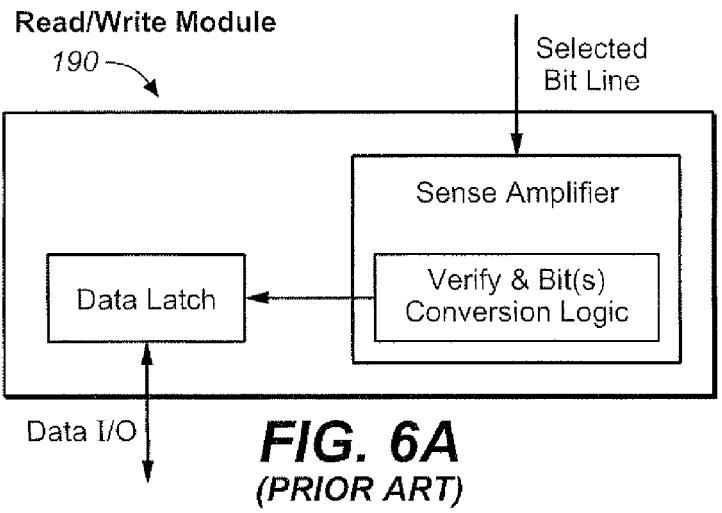
FIG. 6A is a schematic block diagram of an individual read/write module.
Figure 6B:
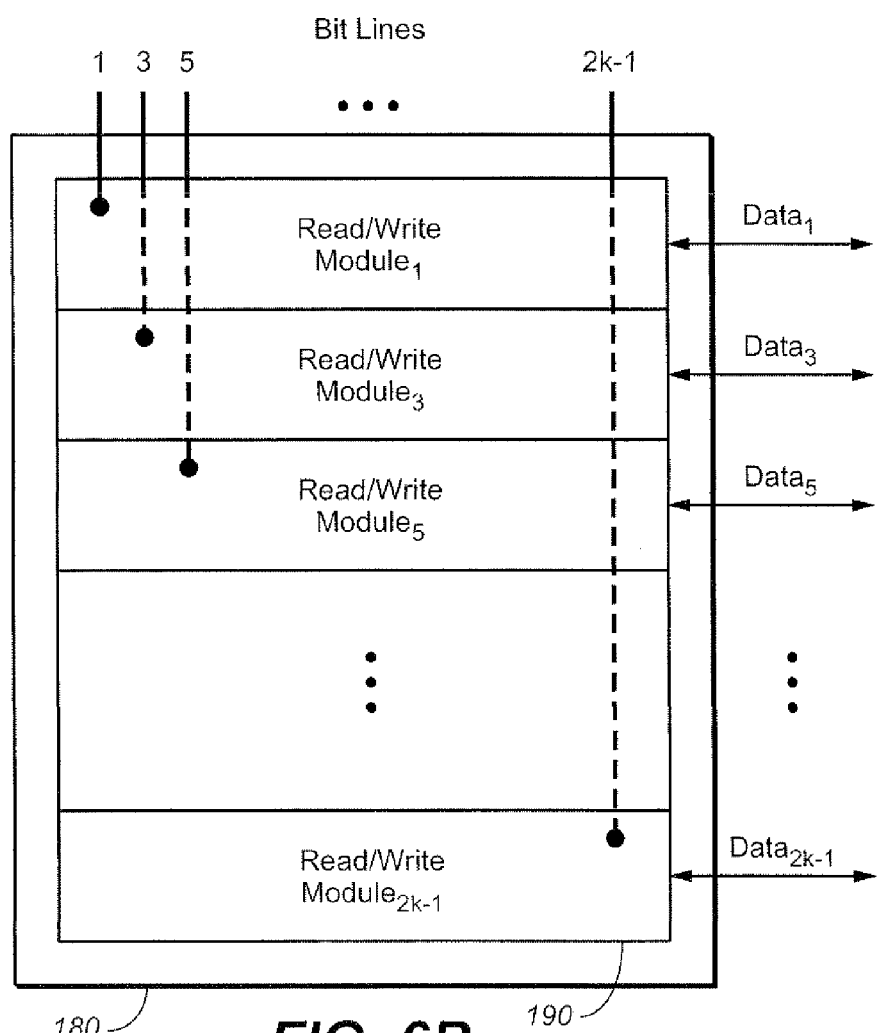
FIG. 6B shows the read/write stack of FIG. 5 implemented conventionally by a stack of read/write modules.
Figure 7A:
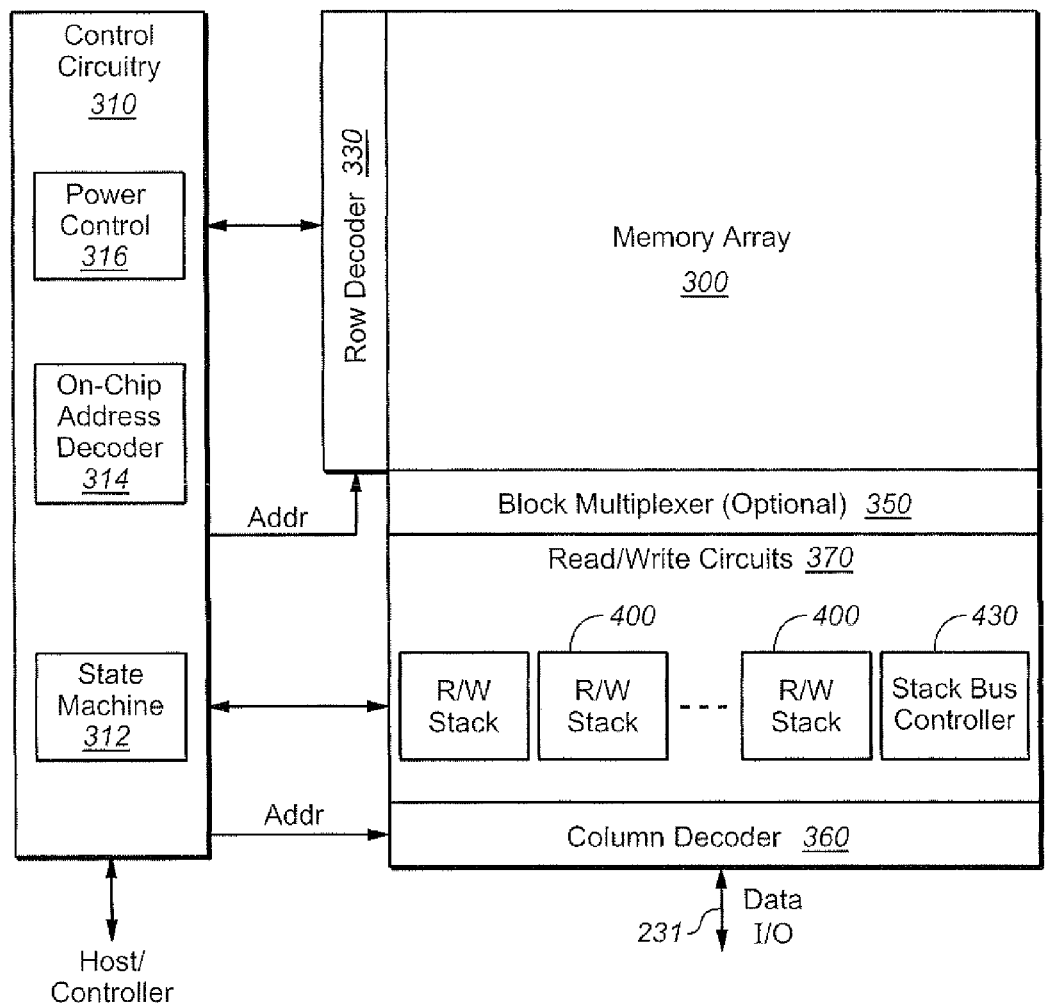
FIG. 7A illustrates schematically a compact memory device having a bank of partitioned read/write stacks, in which the improved processor of the present invention is implemented.

FIG. 7A illustrates schematically a compact memory device having a bank of partitioned read/write stacks, in which the improved processor of the present invention is implemented. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 is implemented as a bank of partitioned read/write stacks 400 and allows a block (also referred to as a "page") of memory cells to be read or programmed in parallel. In a preferred embodiment, a page is constituted from a contiguous row of memory cells. In another embodiment, where a row of memory cells are partitioned into multiple blocks or pages, a block multiplexer 350 is provided to multiplex the read/write circuits 370 to the individual blocks.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 7B:
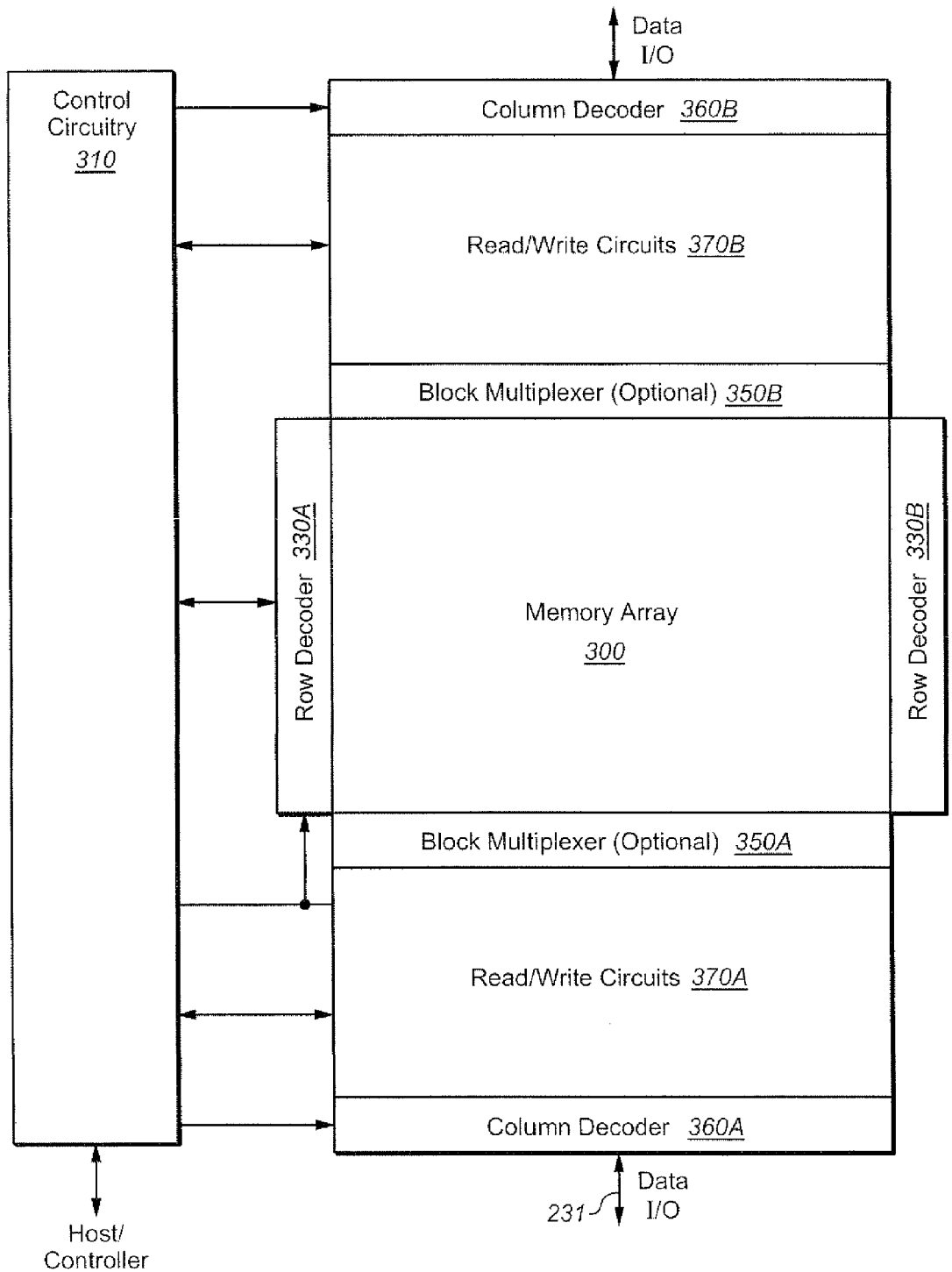
FIG. 7B illustrates a preferred arrangement of the compact memory device shown in FIG. 7A.

FIG. 7B illustrates a preferred arrangement of the compact memory device shown in FIG. 7A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the partitioned read/write stacks 400, is essentially reduced by one half.

Figure 8:
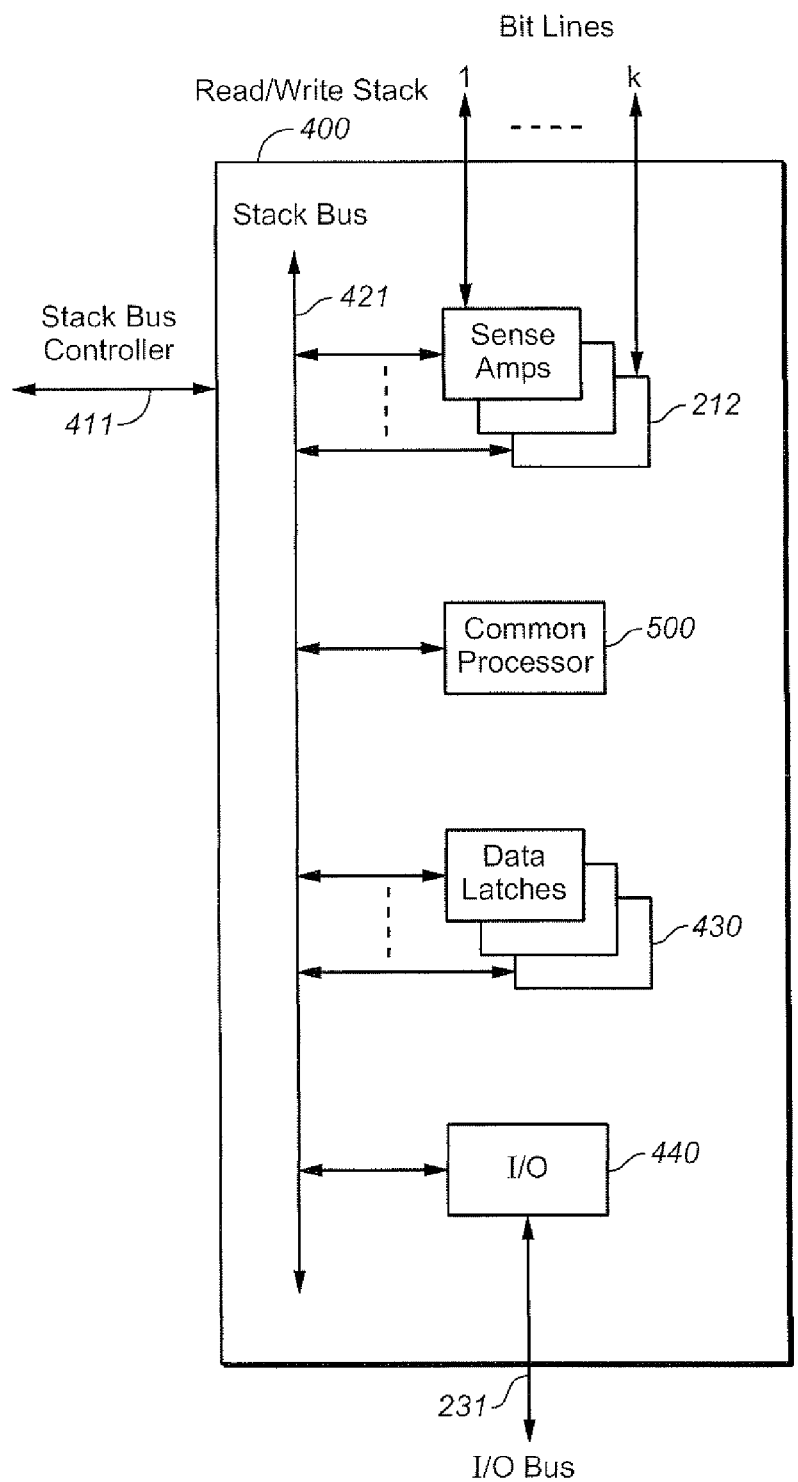
FIG. 8 illustrates schematically a general arrangement of the basic components in a read/write stack shown in FIG. 7A.

FIG. 8 illustrates schematically a general arrangement of the basic components in a read/write stack shown in FIG. 7A. According to a general architecture of the invention, the read/write stack 400 comprises a stack of sense amplifiers 212 for sensing k bit lines, an I/O module 440 for input or output of data via an I/O bus 231, a stack of data latches 430 for storing input or output data, a common processor 500 to process and store data among the read/write stack 400, and a stack bus 421 for communication among the stack components. A stack bus controller among the read/write circuits 370 provides control and timing signals via lines 411 for controlling the various components among the read/write stacks.

Figure 9:
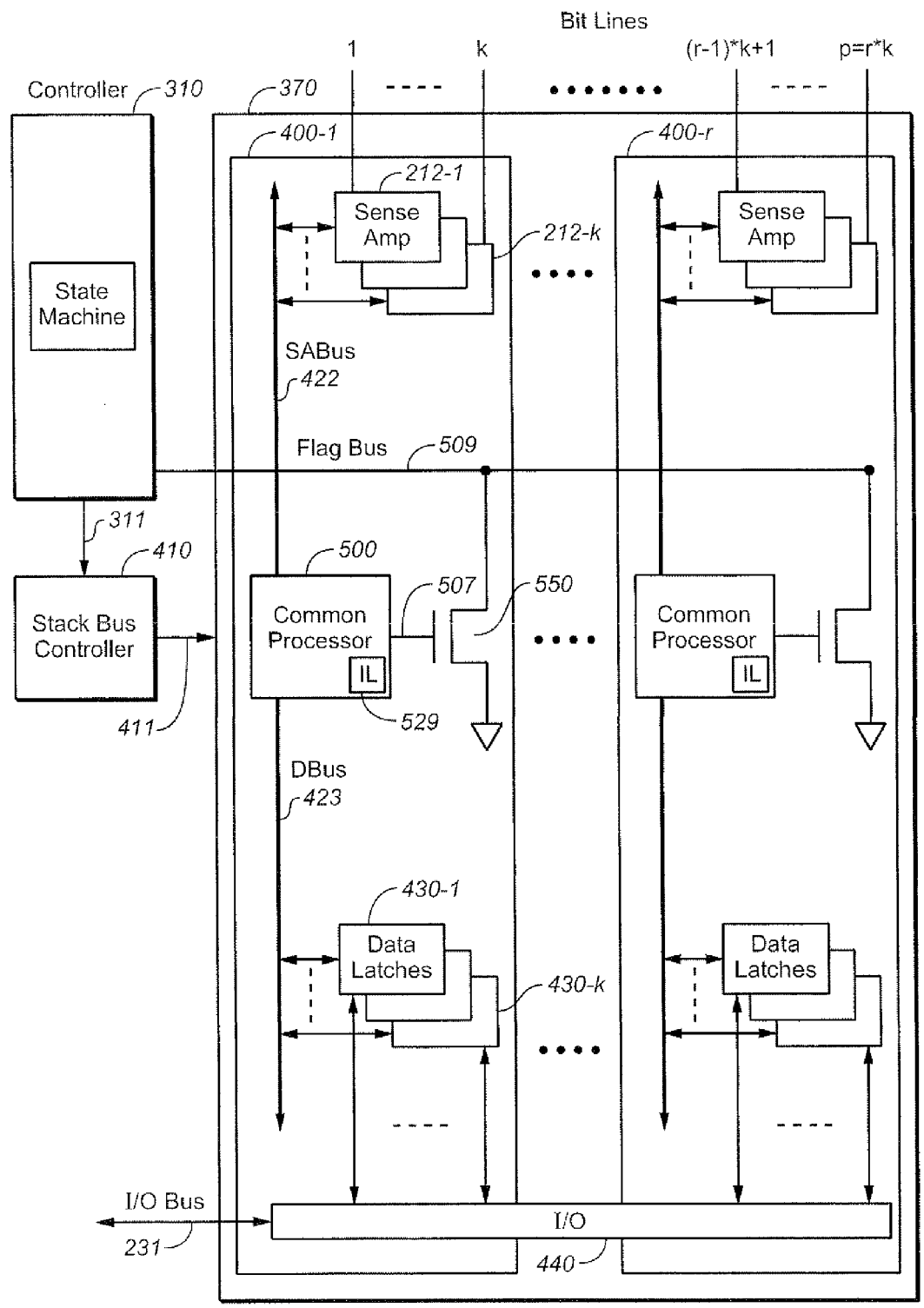
FIG. 9 illustrates one preferred arrangement of the read/write stacks among the read/write circuits shown in FIGS. 7A and 7B.

FIG. 9 illustrates one preferred arrangement of the read/write stacks among the read/write circuits shown in FIGS. 7A and 7B. Each read/write stack 400 operates on a group of k bit lines in parallel. If a page has p=r*k bit lines, there will be r read/write stacks, 400-1, . . . , 400-r.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=512 bytes (512×8 bits), k=8, and therefore r=512. In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells.

Each read/write stack, such as 400-1, essentially contains a stack of sense amplifiers 212-1 to 212-k servicing a segment of k memory cells in parallel. A preferred sense amplifier is disclosed in United States Patent Publication No. 2004-0109357-A1, the entire disclosure of which is hereby incorporated herein by reference.

The stack bus controller 410 provides control and timing signals to the read/write circuit 370 via lines 411. The stack bus controller is itself dependent on the memory controller 310 via lines 311. Communication among each read/write stack 400 is effected by an interconnecting stack bus 431 and controlled by the stack bus controller 410. Control lines 411 provide control and clock signals from the stack bus controller 410 to the components of the read/write stacks 400-1.

In the preferred arrangement, the stack bus is partitioned into a SABus 422 for communication between the common processor 500 and the stack of sense amplifiers 212, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks. (The isolation latch IL 529 is discussed in the following section on bad column management.)

Figure 10:
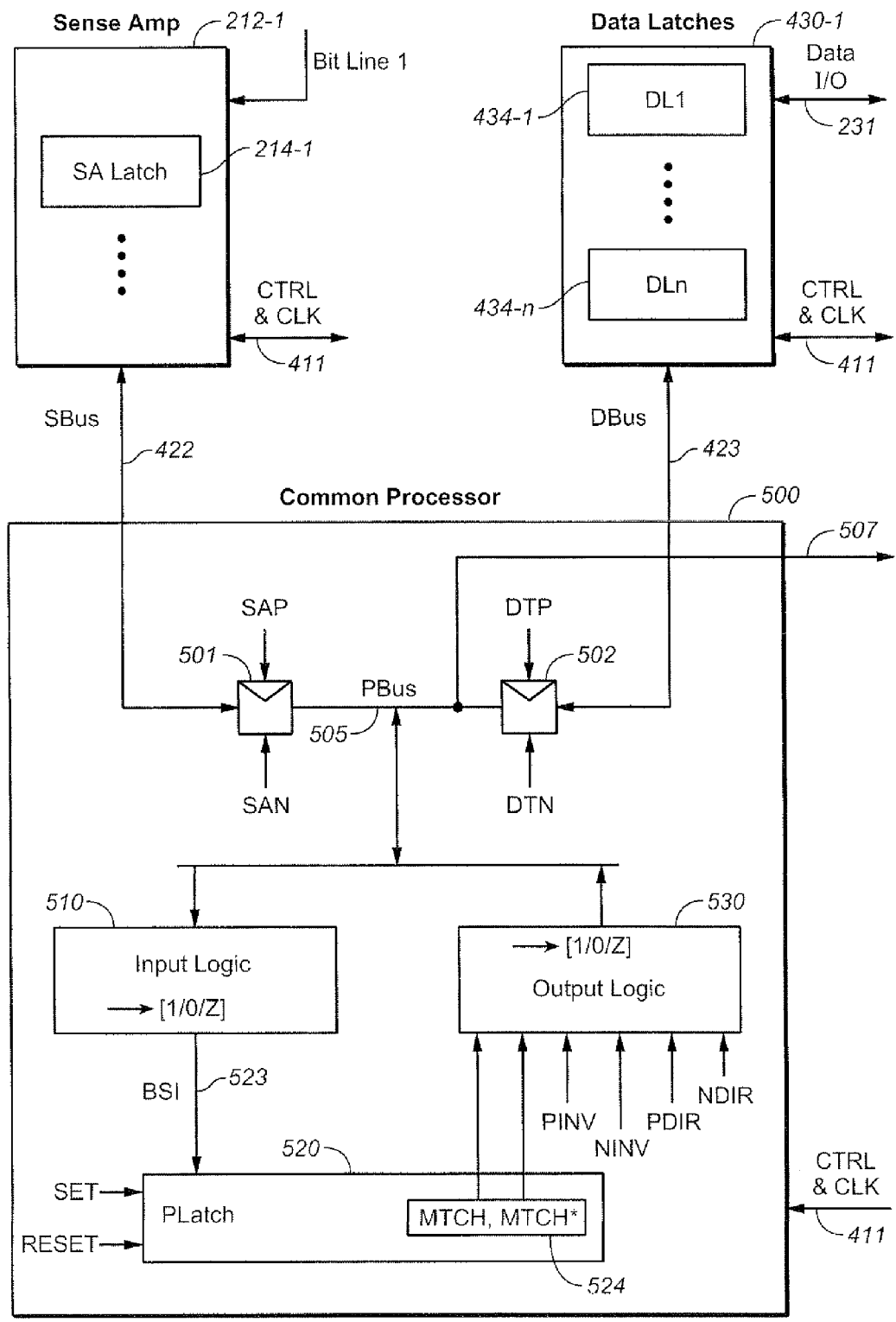
FIG. 10 illustrates an improved embodiment of the common processor shown in FIG. 9.

FIG. 10 illustrates an improved embodiment of the common processor shown in FIG. 9. The common processor 500 comprises a processor bus, PBUS 505 for communication with external circuits, an input logic 510, a processor latch PLatch 520 and an output logic 530.

The input logic 510 receives data from the PBUS and outputs to a BSI node as a transformed data in one of logical states "1", "0", or "Z" (float) depending on the control signals from the stack bus controller 410 via signal lines 411. A Set/Reset latch, PLatch 520 then latches BSI, resulting in a pair of complementary output signals as MTCH and MTCH*.

The output logic 530 receives the MTCH and MTCH* signals and outputs on the PBUS 505 a transformed data in one of logical states "1", "0", or "Z" (float) depending on the control signals from the stack bus controller 410 via signal lines 411.

At any one time the common processor 500 processes the data related to a given memory cell. For example, FIG. 10 illustrates the case for the memory cell coupled to bit line 1. The corresponding sense amplifier 212-1 comprises a node where the sense amplifier data appears. In the preferred embodiment, the node assumes the form of a SA Latch, 214-1 that stores data. Similarly, the corresponding set of data latches 430-1 stores input or output data associated with the memory cell coupled to bit line 1. In the preferred embodiment, the set of data latches 430-1 comprises sufficient data latches, 434-1, . . . , 434-$n$ for storing n-bits of data.

The PBUS 505 of the common processor 500 has access to the SA latch 214-1 via the SBUS 422 when a transfer gate 501 is enabled by a pair of complementary signals SAP and SAN. Similarly, the PBUS 505 has access to the set of data latches 430-1 via the DBUS 423 when a transfer gate 502 is enabled by a pair of complementary signals DTP and DTN. The signals SAP, SAN, DTP and DTN are illustrated explicitly as part of the control signals from the stack bus controller 410.

Figures 11A, 11B:
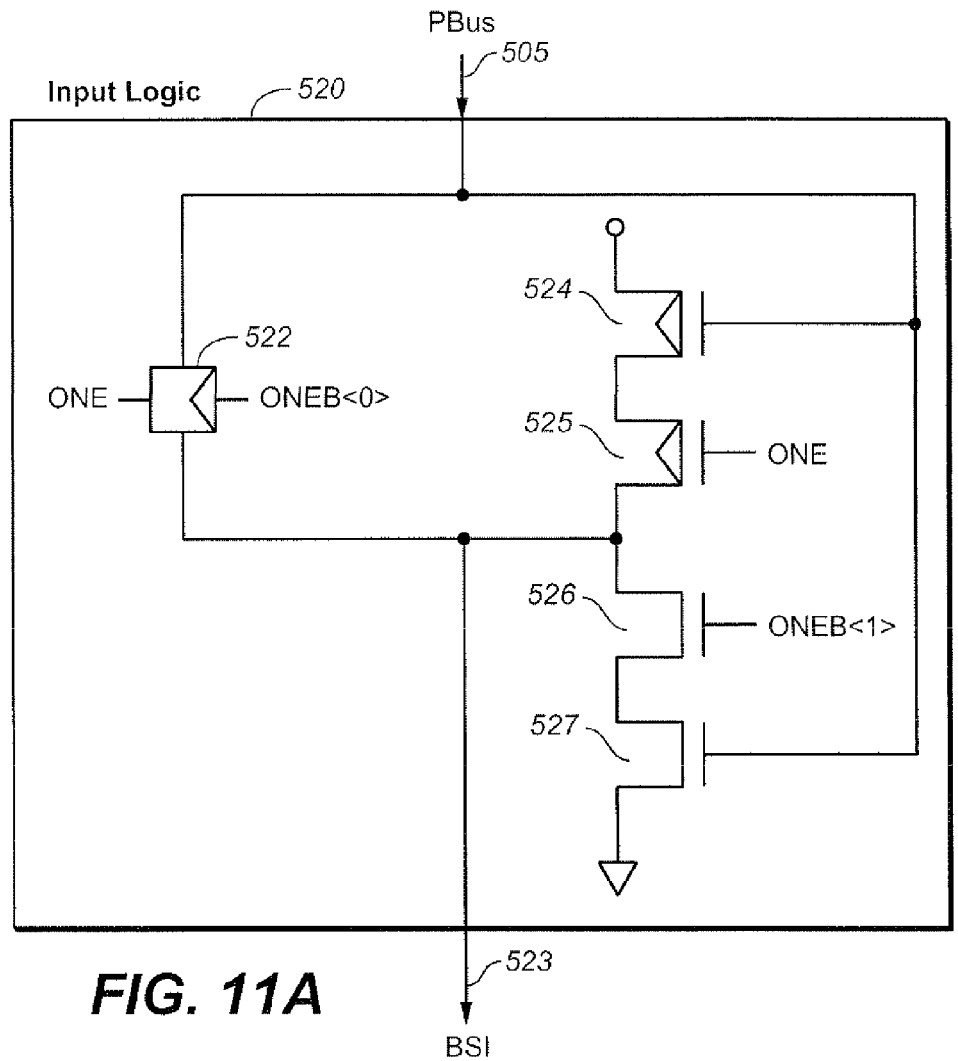
FIG. 11A illustrates a preferred embodiment of the input logic of the common processor shown in FIG. 10.
FIG. 11B illustrates the truth table of the input logic of FIG. 11A.

FIG. 11A illustrates a preferred embodiment of the input logic of the common processor shown in FIG. 10. The input logic 520 receives the data on the PBUS 505 and depending on the control signals, either has the output BSI being the same, or inverted, or floated. The output BSI node is essentially affected by either the output of a transfer gate 522 or a pull-up circuit comprising p-transistors 524 and 525 in series to Vdd, or a pull-down circuit comprising n-transistors 526 and 527 in series to ground. The pull-up circuit has the gates to the p-transistor 524 and 525 respectively controlled by the signals PBUS and ONE. The pull-down circuit has the gates to the n-transistors 526 and 527 respectively controlled by the signals ONEB<1> and PBUS.

FIG. 11B illustrates the truth table of the input logic of FIG. 11A. The logic is controlled by PBUS and the control signals ONE, ONEB<0>, ONEB<1> which are part of the control signals from the stack bus controller 410. Essentially, three transfer modes, PASSTHROUGH, INVERTED, and FLOATED, are supported.

In the case of the PASSTHROUGH mode where BSI is the same as the input data, the signals ONE is at a logical "1", ONEB<0> at "0" and ONEB<1> at "0". This will disable the pull-up or pull-down but enable the transfer gate 522 to pass the data on the PBUS 505 to the output 523. In the case of the INVERTED mode where BSI is the invert of the input data, the signals ONE is at "0", ONEB<0> at "1" and ONE<1> at "1". This will disable the transfer gate 522. Also, when PBUS is at "0", the pull-down circuit will be disabled while the pull-up circuit is enabled, resulting in BSI being at "1". Similarly, when PBUS is at "1", the pull-up circuit is disabled while the pull-down circuit is enabled, resulting in BSI being at "0". Finally, in the case of the FLOATED mode, the output BSI can be floated by having the signals ONE at "1", ONEB<0> at "1" and ONEB<1> at "0". The FLOATED mode is listed for completeness although in practice, it is not used.

Figures 12A, 12B:
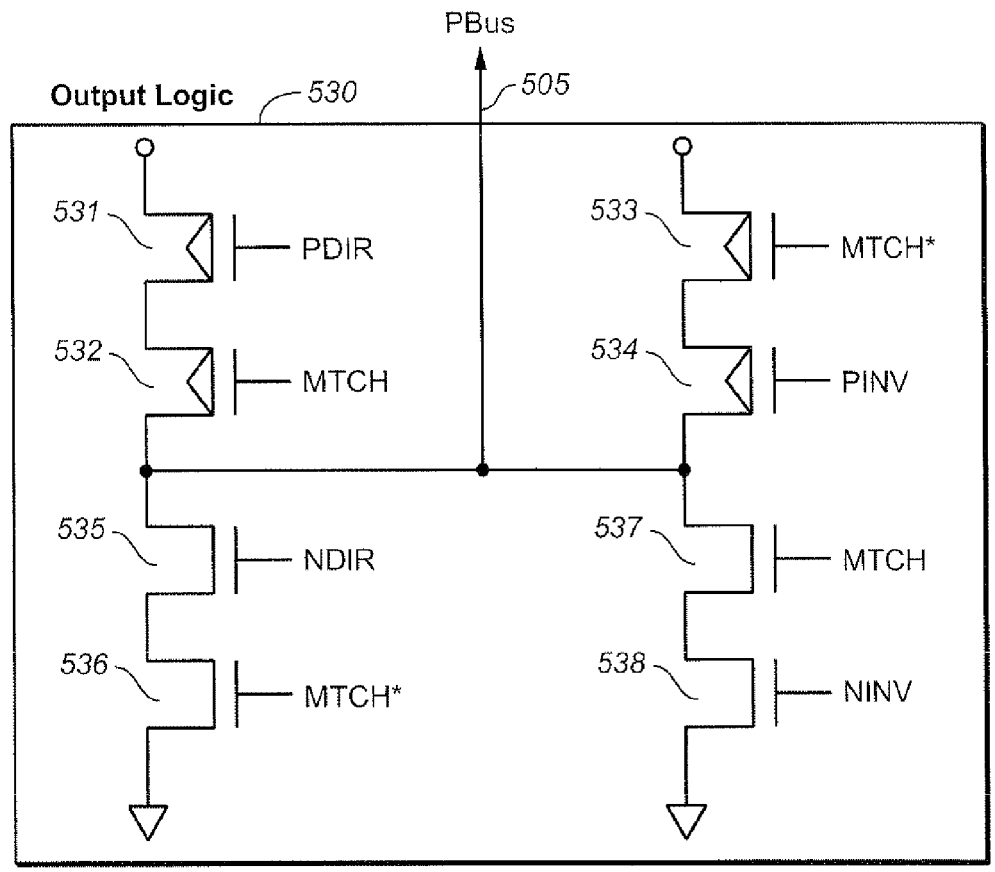
FIG. 12A illustrates a preferred embodiment of the output logic of the common processor shown in FIG. 10.
FIG. 12B illustrates the truth table of the output logic of FIG. 12A.

FIG. 12A illustrates a preferred embodiment of the output logic of the common processor shown in FIG. 10. The signal at the BSI node from the input logic 520 is latched in the processor latch, PLatch 520. The output logic 530 receives the data MTCH and MTCH* from the output of PLatch 520 and depending on the control signals, outputs on the PBUS as either in a PASSTHROUGH, INVERTED OR FLOATED mode. In other words, the four branches act as drivers for the PBUS 505, actively pulling it either to a HIGH, LOW or FLOATED state. This is accomplished by four branch circuits, namely two pull-up and two pull-down circuits for the PBUS 505. A first pull-up circuit comprises p-transistors 531 and 532 in series to Vdd, and is able to pull up the PBUS when MTCH is at "0". A second pull-up circuit comprises p-transistors 533 and 534 in series to ground and is able to pull up the PBUS when MTCH is at "1". Similarly, a first pull-down circuit comprises n-transistors 535 and 536 in series to Vdd, and is able to pull down the PBUS when MTCH is at "0". A second pull-up circuit comprises n-transistors 537 and 538 in series to ground and is able to pull up the PBUS when MTCH is at "1".

One feature of the invention is to constitute the pull-up circuits with PMOS transistors and the pull-down circuits with NMOS transistors. Since the pull by the NMOS is much stronger than that of the PMOS, the pull-down will always overcome the pull-up in any contentions. In other words, the node or bus can always default to a pull-up or "1" state, and if desired, can always be flipped to a "0" state by a pull-down.

FIG. 12B illustrates the truth table of the output logic of FIG. 12A. The logic is controlled by MTCH, MTCH* latched from the input logic and the control signals PDIR, PINV, NDIR, NINV, which are part of the control signals from the stack bus controller 410. Four operation modes, PASSTHROUGH, INVERTED, FLOATED, and PRE-CHARGE are supported.

In the FLOATED mode, all four branches are disabled. This is accomplished by having the signals PINV=1, NINV=0, PDIR=1, NDIR=0, which are also the default values. In the PASSTHROUGH mode, when MTCH=0, it will require PBUS=0. This is accomplished by only enabling the pull-down branch with n-transistors 535 and 536, with all control signals at their default values except for NDIR=1. When MTCH=1, it will require PBUS=1. This is accomplished by only enabling the pull-up branch with p-transistors 533 and 534, with all control signals at their default values except for PINV=0. In the INVERTED mode, when MTCH=0, it will require PBUS=1. This is accomplished by only enabling the pull-up branch with p-transistors 531 and 532, with all control signals at their default values except for PDIR=0. When MTCH=1, it will require PBUS=0. This is accomplished by only enabling the pull-down branch with n-transistors 537 and 538, with all control signals at their default values except for NINV=1. In the PRECHARGE mode, the control signals settings of PDIR=0 and PINV=0 will either enable the pull-up branch with p-transistors 531 and 531 when MTCH=1 or the pull-up branch with p-transistors 533 and 534 when MTCH=0.

Common processor operations are developed more fully in U.S. patent application Ser. No. 11/026,536, Dec. 29, 2004, which is hereby incorporated in its entirety by this reference.

Bad Column Management with Bit Information

A memory will often have defective portions, either from the manufacturing process or that arise during the operation of the device. A number of techniques exist for managing these defects including error correction coding or remapping portions of the memory, such as described in U.S. Pat. Nos. 7,405,985, 5,602,987, 5,315,541, 5,200,959, and 5,428,621. For instance, a device is generally thoroughly tested before being shipped. The testing may find a defective portion of the memory that needs to be eliminated. Before shipping the device, the information on these defects is stored on the device, for example in a ROM area of the memory array or in a separate ROM, and at power up it is read by a controller and then used so that the controller can substitute a good portion of the memory for the bad. When reading or writing, the controller will then need to refer to a pointer structure in the controller's memory for this remapping.

In previous arrangements for managing bad columns, such as in U.S. Pat. No. 7,405,985, when there is an error in a column, the whole column is typically mapped out, with the corresponding whole byte or word will be marked to be bad. According to the aspects presented in this section, the system can detect when only 1 bit in the byte is bad and bytes with single bit failures can be utilized as long as the single bit is saved elsewhere in the memory. Through the analysis of the any defective columns, it can be determined whether they are in the category where the whole will be treated as bad or whether it only has only single bit failures so that the other bits in the bad columns can be used as good. In an exemplary application, during the die sort, those single bit failures and their column address as well as bit address can be detected and saved in a non-volatile ROM block. When the controller manages these bad columns by this information, the bit information can be used to extract the corresponding bits saved in a column redundancy area. The can consequently enhance the yield so that more defects can be repaired by the column redundancy, since columns with only single bit errors can still be used, rather than mapped out.

More specifically, each column of the memory has an associated isolation latch or register whose value indicates whether the column is defective, but in addition to this information, for columns marked as defective, additional information is used to indicate whether the column as a whole is to be treated as defective, or whether just individual bits of the column are defective. The defective elements can then be re-mapped to a redundant element at either the appropriate bit or column level based on the data. When a column is bad, but only on the bit level, the good bits can still be used for data, although this may be done at a penalty of under programming for some bits, as is described further below. In an exemplary embodiment, the bad column and bad bit information is determined as part of a self contained Built In Self Test (BIST) flow constructed to collect the bit information through a set of column tests. Based on this information, the bad bits can be extracted and re-grouped into bytes by the controller or on the memory, depending on the embodiment, to more efficiently use the column redundancy area. These techniques and structures can be applied to the various memory architectures described above, including NOR architectures, NAND architectures, and even the sort of 3D memory structures described in U.S. patent application Ser. No. 12/414,935. When reference to a specific memory architecture is useful, NAND flash memory will serve as the exemplary embodiment.

Returning briefly to the case of where bad columns are managed without bit information, non-volatile memories usually have redundancy to repair on-chip failures. Column redundancy is used to repair the bad columns, where the repair unit is normally one byte as a unit, or sometimes a word as a unit. Under this arrangement, even for a 1 bit fail in the 1 byte, the whole byte will be marked to be a bad column and the data will be moved to the redundancy area. This is a convenient way to isolate the bad column as a group of bad bitlines, but the penalty is that the redundancy repair unit could be exhausted fairly rapidly. The bad column address is normally saved in the ROM block of the non-volatile memory. In the exemplary embodiments below, there are 13 column addresses, A<13:1>. The format for column redundancy data can then use 2 bytes to remember one column address. There are 2 flag bits to indicate that it is a unused column redundancy, or a used column redundancy, or a Bad column redundancy, as shown in the table of FIG. 13. The reason to isolate at the one byte or one word level is that isolation latch takes some area, it will typically not be practical to have an isolation latch for every bad bitline. In the exemplary arrangement used here, the purpose of the isolation latch is to ignore the programming/erase result of that byte or word. In an NAND-type architecture, operations are done in parallel where good and bad bits are done for each of the read, program, or erase simultaneously. In one particular embodiment, the isolation latch can be included as part of the common processor 500 (FIG. 9) circuitry, where it is illustrated schematically as IL 529 in FIG. 9 and on the standard implementations of a latch circuit. As part of the common processor for the associated k bitlines, it can function as described in the following. (As noted, the one latch in this implementation serves for the word or byte (k=8 or 16), rather an embodiment with a latch for each bit line, in which case there would be such a latch associated with each bit line/sense amp 212 in FIG. 9.) This isolation latch is used in the case that the data latches associated with the sense amps are subjected to defects, since they are drawn according to a tighter layout design rule. In the case that the data latches could be guaranteed to be 100% perfect, the isolation latch is not necessary. In the latter case, the data in the bad bit will be filled with a data bit—a don't care data pattern; but the general principle described here still applies: i.e. the bad bitline caused by the memory array failure can be extracted from the bad bytes and re-grouped into a new byte with other bad bits and write to a new good location in the memory.

FIG. 13 illustrates an example of a format for column redundancy data without bit information. The first two columns show the values of the two flag bits for an unused redundant column, a redundant column being used, and a bad redundancy column. (The flag value of (1,0) is used here and so an illegal case, but could be reserved for other cases.) For the embodiment shown here, the unit is taken as the word and the address AA[1] distinguishes between the two bytes of the word, here referred to as the high and low byte. How each of the two of the format are used is then shown to the right. In each of these cases, the two most significant bits of the high byte hold the flag bits. For both an unused column and a bad column, there is not address to hold, so the remaining values are set to 1. If the redundant column is being used, the column it is replacing can have its addressed stored as shown in the example. (As the example has 13 column address, two bytes are sufficient to hold a column address and the two flag bits, where the number can be changed according to the number of column addresses the system uses.) When a redundant column is bad, it is also isolated and also marked to be bad with the flag. When a (non-redundant) column is bad, this will be indicated by the value of specific memory locations in the ROM pages/blocks on the non-volatile memory and/or an associated isolation latch. The bad column information can be retrieved either at the power on sequence or before each pages are operated on.

Bad columns can classified as one of two types: those such as an related to bitline short or open circuit, where there can be multiple bad bit failure, and the whole column is taken as defective; and those such as defects in the data latches or sense amps, which are typically individual bit failures. To keep the physical array structure simple and save on die size, the latch or register that indicates a column is bad (the isolation latch) uses one 1-bit latch per byte. (For architectures that have a top and bottom latch that would be isolated together, then one defect will isolate 2 bytes (1 top, 1 bottom).) If the minimum repair unit is taken as a byte or a word, this could cause inefficiency in the management of bad columns, since, typically, most of the bits in the bad columns are good bits which can be used.

It should be noted that when the isolation latch is set under this arrangement, this does not mean the column is no longer accessible, just that it is marked as "don't care" with respect to program or erase completion. Under this arrangement, columns that are defective on the bit level will have their isolation set and not counted among the good columns; however, even though the bad columns are "isolated", the cells will get programmed (and erased) and verified. At the end of a program operation, however, at the isolation latch is set, any of their bits that have failed to program (slow bits) will not get counted as part the total failure count. Therefore, these bad columns do not participate in the pseudo-pass criteria for programming (or erase) and there may consequently be some cells that are under-programmed (or under-erased) but un-detected. As these are slow cells in the normal good columns, the number of program (erase) pulses will be applied on the wordline to make sure that the data will be programmed (or erased) successfully. Additionally, as stronger ECC capability is available to the non-volatile memory system, it allows for the system to take care of most of the slow bits.

For example, the system may have an allowance for 40 bits fail during programming. Taking a programming operation as having, say, 9000 bytes, the ratio of failed bits is then 40/(9000*8). If 24 columns have been replaced with redundancy columns, where each byte has 1 bit bad bitline, and with 7 bits per byte programming without detection, then the number of failed programmed bits will be {24*2*7*40/(9000*8)}=4 bits failure. The rest of the bits (24×7), besides the bad bitlines, in the bad column will be programmed correctly and these 4 bits can be managed by the error correction code.

FIG. 14A shows a Column Redundancy Data (CRD) table format that includes bad bit information. As shown there, an extra pair of bytes will be added to each bad column information shown as the lower pair of low, high rows. These will indicate which bits are bad, where the bad bit is indicated by "0". The good bits will be indicated with '1'. For both the unused columns and the bad redundancy columns, this information is not relevant and all the entries are set to "1". For bad column where the whole column is taken as bad (whole bit failure), all entries are set at "0" and this corresponds to the situation in FIG. 13. In the case of single bit failure, the additional entries indicate which bits of the column are bad, and need to be mapped out, and which bits are good. In this example, two bits (bit 6 of both bytes) are bad as indicated in by the "0", with the good bits having a "1". (It just happens that both bytes have bit 6 bad in this example and the bad bits need not line up in this way.)

In another embodiment, the mode of failures can be recorded in the bad column information. FIG. 14B shows an example where only one flag indicates a used redundancy column or a bad redundancy column. Mode 0 and mode 1 are the two bits indicating the failure modes: 01—bitline open; 10—bitline short; 11—data latch failure; 00—others cases. If two kinds of failure exist on the same byte (low probability case), only the latest failure mode is recorded. The increase of the 2 bytes for each bad column will not increase the die size, since the CRD data will be saved in one ROM block in the memory. ROM space usually is large enough to save all the require information for bad column. The failure mode information may be used by the controller for various applications, for example to digitally correct floating gate to floating gate capacitive coupling effects that can occur in EEPROM based memories.

According to one aspect presented here, during die sort or the built in self-test (BIST) test flow discussed in the following, the bad columns can be tested bit by bit in multiple column tests and failed bit information will be accumulated into a CRD table such as FIG. 14A or 14B.

Thus, in the arrangement presented here, the number of failed bits can be recorded in the one of these formats, which allows the column redundancy data to record multiple bit failures for a column. The bad column can be managed by the memory circuits as well as controller. For the simplicity of presentation, the description here is mainly given for the case when the controller manages the bad columns. Similar function can also be achieved by the circuits inside the non-volatile memory. During the program process, the controller will load the user program data intro the data latches inside the memory. The location corresponding to the bad bits can be left with user data or filled with "1", but the copy of the data will also be saved in a good bit location in the redundancy column area. As isolated bad columns with bit errors will have some good data they will going through the program (or erase) process, and so the bad bit can just have their data latched for them as well as in the remapped location. Regardless of the data in the bad bitline, the operations can be done collectively on all cells without increasing the power consumption in NAND flash architecture. In some other architecture, such as, NOR flash or 3D Read/Writable architecture, the bad bitlines are filled with data of non-operation to avoid extra power loss.

The replacement of bad bits with good bits from the redundancy columns can be illustrated schematically using FIGS. 15-16, which are respectively a program situation, where the data is loaded to the normal locations and the bad column data is moved to the redundant column area, and a read situation, where the sensed data in redundant area is moved to the right location in the user bytes. As shown there, several of the cells (at addresses A2, A6, A8, A13, A15, A28) are defective and there intended content is written into the redundancy section at left, where the same addresses are shown shaded. During the read process, the whole wordline data will be sensed to the data latches. The data may be transferred out to the controller. The controller side will fetch the good bits from the redundant area and move them to the correct location according to the bad column map table shown in FIG. 14A or 14B. This process is illustrated by FIG. 16, which is a sort of inverse of FIG. 15, where the good bits in the redundancy section are read out and substituted for the defective cells they are standing in for. In FIGS. 15 and 16, the Xs to the left, regular column area, indicated the defects mapped into the redundancy area to the right, where the Xs to the far right are unused spares and X between the remapped A6 and A8 values indicates as defective redundancy column.

The Build In Self Test (BIST) mechanism for bad column addresses with bit information referred to above will now be described. This uses an algorithm to determine the bad column with bit information. A state machine on the memory itself (not the controller) can execute the process for externally supplied test sequences and corresponding test data. The flow chart of FIG. 17 will illustrate the steps. A major difference from what would be a corresponding algorithm that did not need to determine bit level errors, but only column level defects, is that the bad column is NOT isolated right after each column test. This is because the same column will be tested again. Another difference is that the error in the IO values (see FIG. 14) will be recorded for the each bit.

Figure 17:
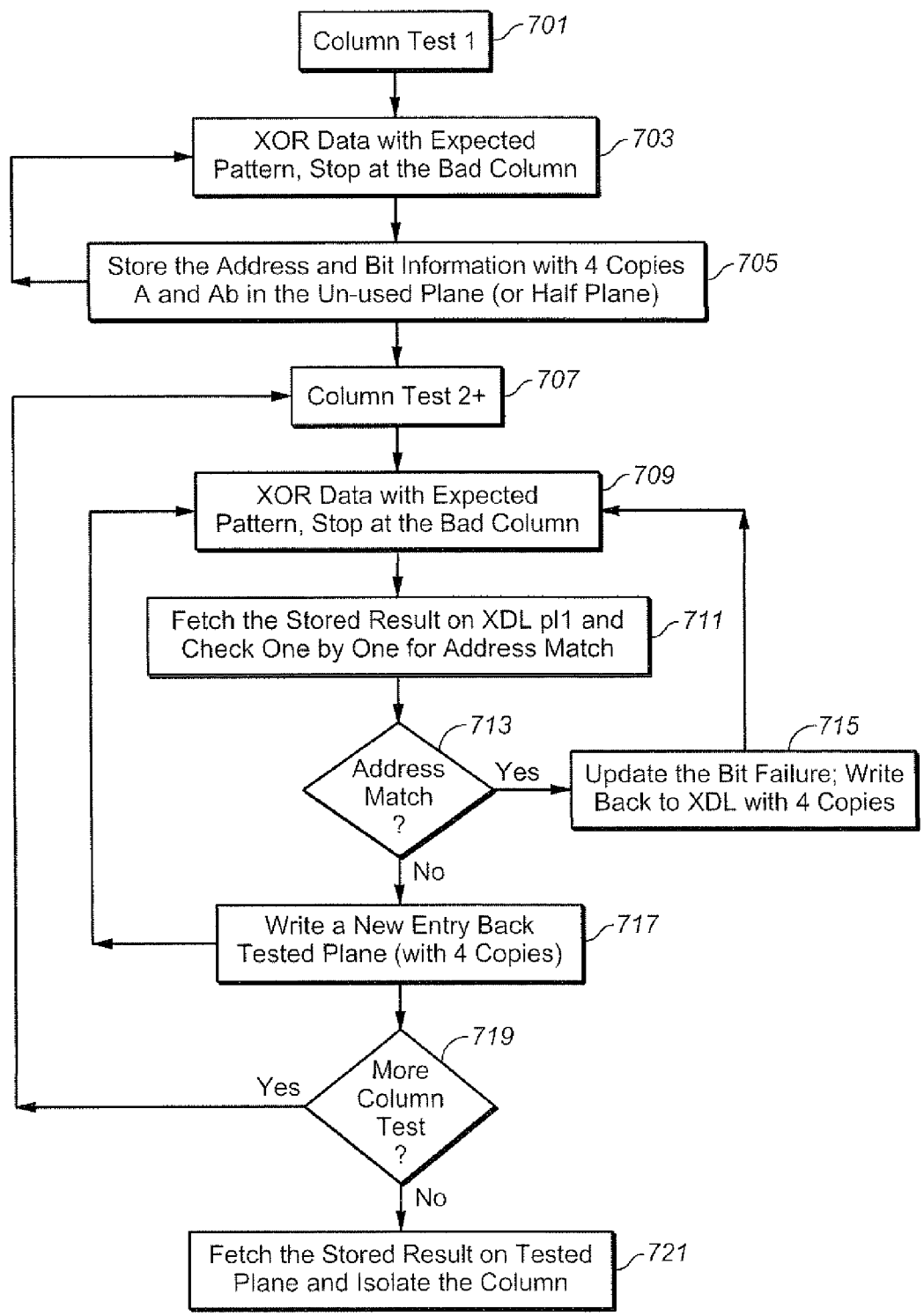
FIG. 17 is an exemplary flow for a built in self-test algorithm.
Figure 18:
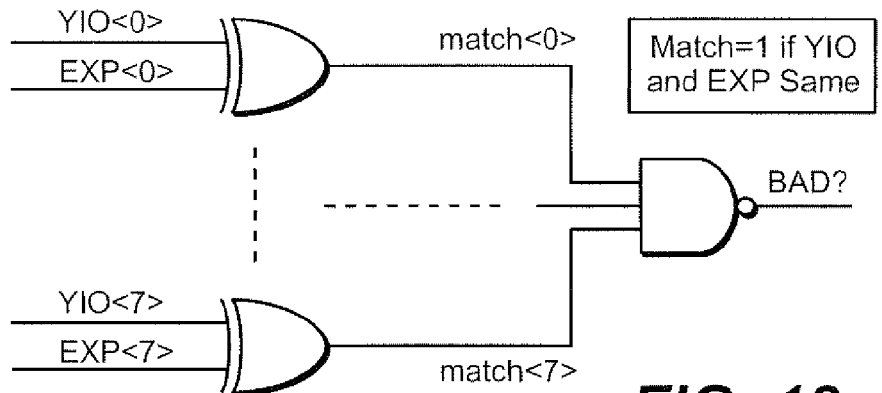
FIGS. 18-20 show some examples of circuitry that can be used to implement some of the elements of the flow of FIG. 17.

FIG. 17 begins at 701 with starting the first of the tests (Column Test 1) in the externally provided series. At 703, the expected data pattern is compared with the data as written to and read back from the column, going through the columns and stopping at bad columns, as indicated by the loop of 703 and 705. A circuit for executing this on the memory is shown in FIG. 18, where the read out data is compared with the expected data pattern to check the column error. As shown there, each of the expected values (EXP<7:0>) is compared to the respected value for the column as read out on the IO bus (YIO<7:0>). This yields the corresponding match values for each bit, which are then combined to yield the BAD value as output. If BAD=1, at 705 the column address and match<7:0> value are recorded. This is preferable stored outside the array for now as the array is still undergoing testing. For instance, in a multi-plane memory, this could stored in an unused plane. (Although the other plane data latches may have unknown defects, multiple copies can be used to guarantee the data integrity. For example, one set of data can be transferred to a set of data latches in the un-used plane with 4 copies of original data. If the chip has only one plane, separate data latches into Left/Right or Top and Bottom partitions can be used. Only one partition of the bitlines is tested at a time, the other partition is used for temporary storage.)

To improve robustness, multiple copies of the column redundancy information (FIGS. 14A, 14B) are preferably saved along with complementary data (A and Ab copies). By saving the data in both the A and Ab form, these can readily be compared to see if the data is corrupted. On retrieving the data, the data and complementary data will be compared, if they match, then the data will be validated to be good data. If the compare fails, then this copy of data will be discarded and next copy of data will be fetched and compared until a good copy is found. Another method of getting the correct data is that all the copies of data are fetched and voted with the majority logic to determine the right data.

Figure 19:
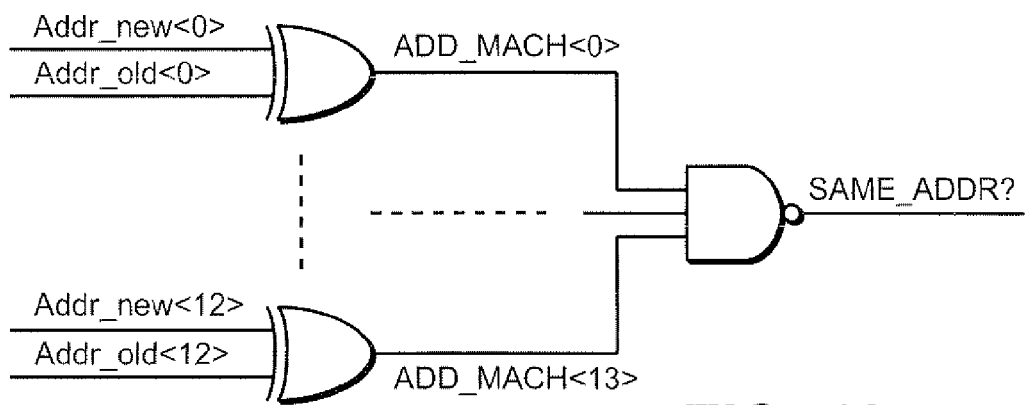
Figure 20:
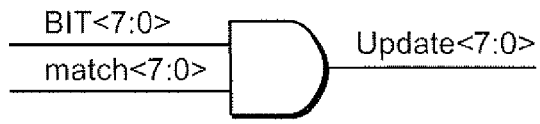

At 707, the next test is begun, with the expected data for this test again compare with the read out data at 709. The stored result from 705 is then fetched at 711 and compared with that from 709 for any address matches between the two. Address match can be done with XOR logic as well, with an exemplary circuit for this is shown in FIG. 19, which can compare the address of the new bad column with the bad column address found in the previous test to see these two address match or not. This is shown for the exemplary embodiment of 13 columns, where the Addr_new values are from 709 and the Addr_old are from 705. The results of the comparisons (ADD_MATCH<12:0>) will generate logic signal SAME_ADDR, corresponding to 713. In case of an address match, the bit failure information can be updated and written back to where it is being held. The bad bit information update can be done with AND logic as in FIG. 20. The bad bit information is updated when the bad address matches the previously found bad column address. Some tests may have same bad bit address, some tests may turn out to have different bit address.

If there is no match at 713, a new entry is written back at 717. Both 715 and 717 loop back to 709 and the process continues until the current test is done for all columns, after which the flow decides if there are more tests at 719. If so, the flow loops back to 707 and if not, at 721 the stored results from the series of test are fetched and the isolated latches set for the columns found defective. The bad column information will also be written into the designated ROM block in the non-volatile memory. In some cases, the test flow could be broken into tests done at different times. The test result can be stored in the ROM block for first few tests, and then the data will be read back from the ROM block and continue with the subsequent tests following same test algorithm as described above. Although the embodiment presented above is for an initial sort based upon externally provided tests, alternate embodiments could be performed to dynamically update the defect information, based on tests executed, for example, by the controller or sophisticated tester.

Figure 21:
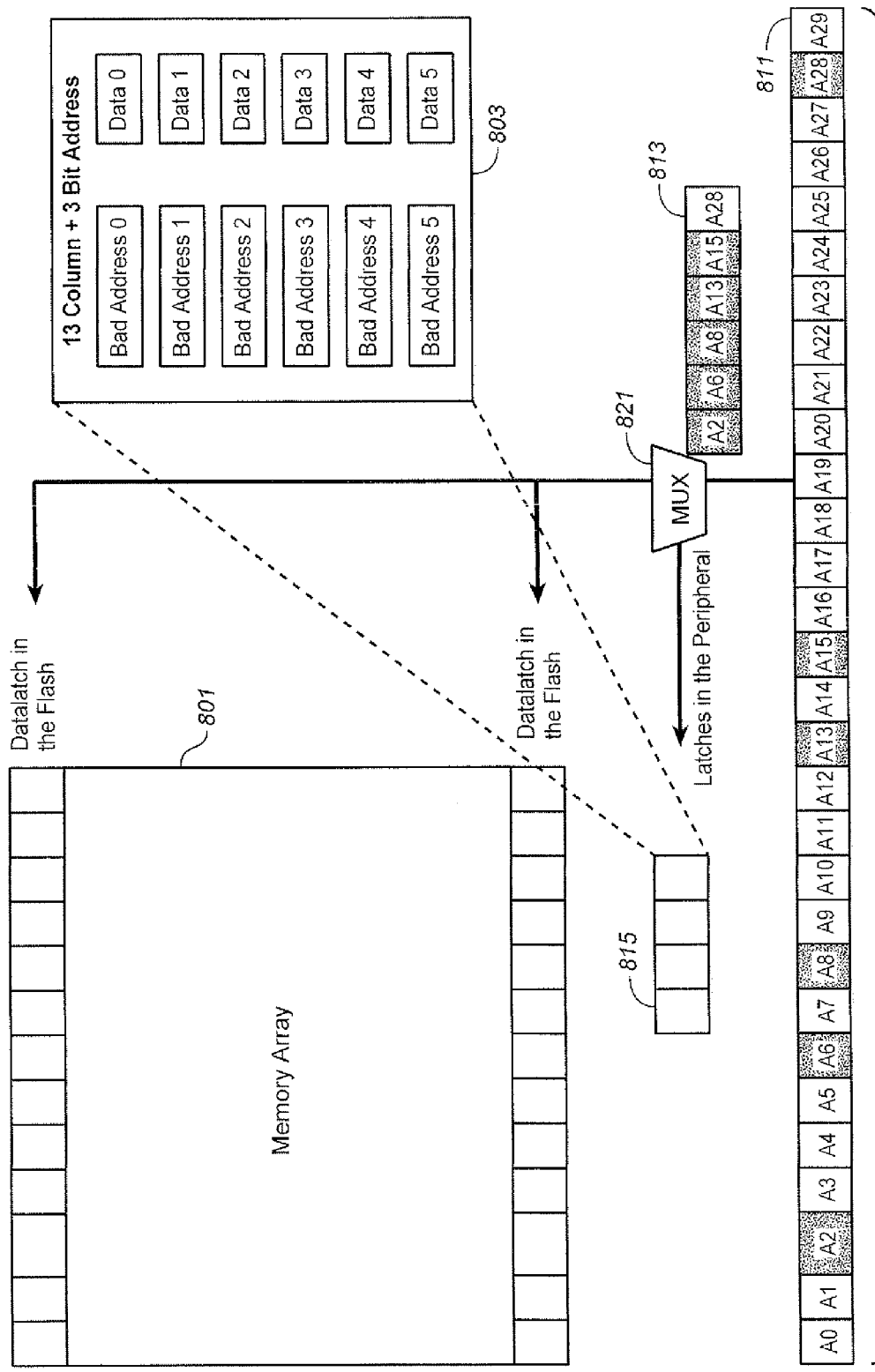
FIG. 21 is a schematic representation of the on-chip management for bad bits.

FIG. 21 is a schematic illustration for the on-chip management of the bad bits. A set of data to be written onto a wordline of array 801 is represented by addresses A0-A29, corresponding to regular, non-redundancy columns. Without taking any defects into account, this set of data would be transferred to the appropriate data latches along the top and bottom of the array (as shown schematically by the arrows, corresponding to bus structures) and then written into the array. Considering now some defects, the bits at addresses A2, A6, A8, A13, A15, and A28 for this wordline and these columns are here taken as defective. Based on the addresses for these bits, the data for these bits are intercepted at a multiplexer MUX 821 and held in latches 815 in the periphery and then programmed into the redundancy area 803, where the data along with its corresponding address is held. In this example, 13 bits of address are used to specify the column to which the data corresponds and 3 bits specify the bit within that column. The data values for these bad addresses can also be loaded into the data latches along the array or, if desired, they could be replaced with blank data as the content of these addresses will be replaced with the data from the redundancy area during a read. In other embodiments, the multiplexing of values can be executed on the controller.

Considering the data in process further, this can be taken as the steps of:
1) Data Shift into the Flash Memory and store the bad bytes in the peripheral latches;
2) The data will be packed into smaller data bytes by only extract the data from bad bits;
3) Transfer the data to Column Redundancy columns.

Figure 22A:
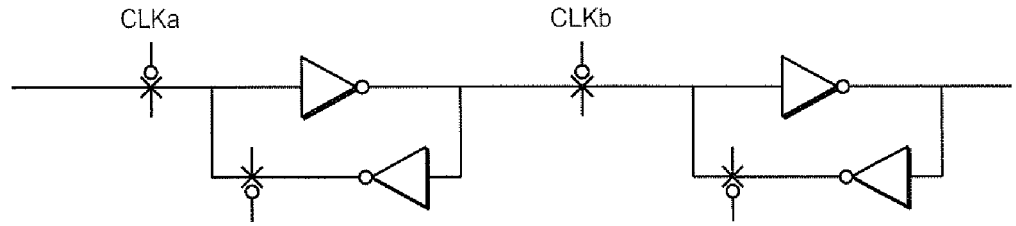
FIGS. 22A and 22b are examples of data latches that could be used for data compactification.
Figure 22B:
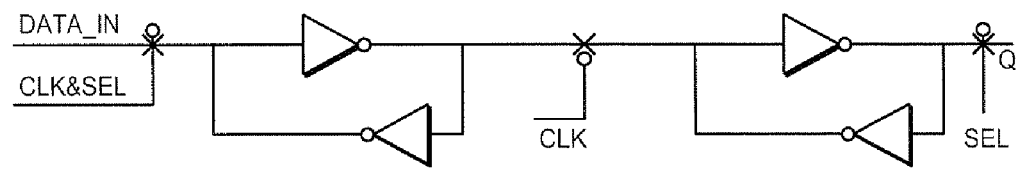
Figure 23:

The shifting can be executed by a set of clocked latches, examples of which is shown in FIGS. 22A and 22B, allowing the data to be compacted for storage in the redundancy area, as can be illustrated with FIGS. 23-25. The latch structure of FIG. 22A would correspond to that used for the pointer, as at the top of FIG. 24 or FIG. 26, and the latch structure of FIG. 22B would correspond to that used for the data in and data, as at the bottom of FIG. 24 or FIG. 26

FIG. 23 shows a stream of incoming data. This shows a series of bytes with the bad bits shown, the main part of the address (e.g., A2) showing the column and the subscript indicating the bit in the byte along that column (e.g., the wordline of a NAND string) that is bad. Some bytes have multiple bad bits, others only a single bad bit. (Only the bytes with addresses corresponding to bad bits are shown.) Under each bit is the bad bit information, "1" for good bits and "0" for bad. To save on storage space, the bad bits can be compacted using data latches such as that shown in FIGS. 22A and 22B: When the bad bit information is "1", the latch will be selected and the bit data will flow out at the output. FIG. 24 shows a pointer based arrangement for column selection that can be used to compact the data. (The use of pointers for column selection is discussed further in U.S. Pat. No. 7,405,985 and references cited therein.) Across the top is a series of latches (as in FIG. 22A) allowing the pointer to propagate one clock to toggle through all the latches. The data latches at the bottom (as in FIG. 22B) receive the unpacked data and provide the packed version at DATA_OUT. FIG. 24 functions similarly to FIG. 26 discussed below, which unpacks the data. This compacted data will then transferred to the data latches FIFO and formed into new bytes, as shown in FIG. 25, where the data from non-defective bits have been removed, leaving only that corresponding to the defects.

The data out process will need undo the data in process and can be taken as the steps of:
1) After the sensing, the data in the column redundancy columns are transferred out to the peripheral data latches;
2) The data will be re-shuffled back to byte form corresponding to each bad columns, where the good bit data can be filled with "1";
3) The multiplexer mixes the data from the peripheral latches back in when the user toggles out the data and the column address maps to the bad columns.

The data out process (un-packing the data), may use many clock cycles to finish the task. One arrangement for doing this can be illustrated with FIGS. 26-28.

Figure 26:
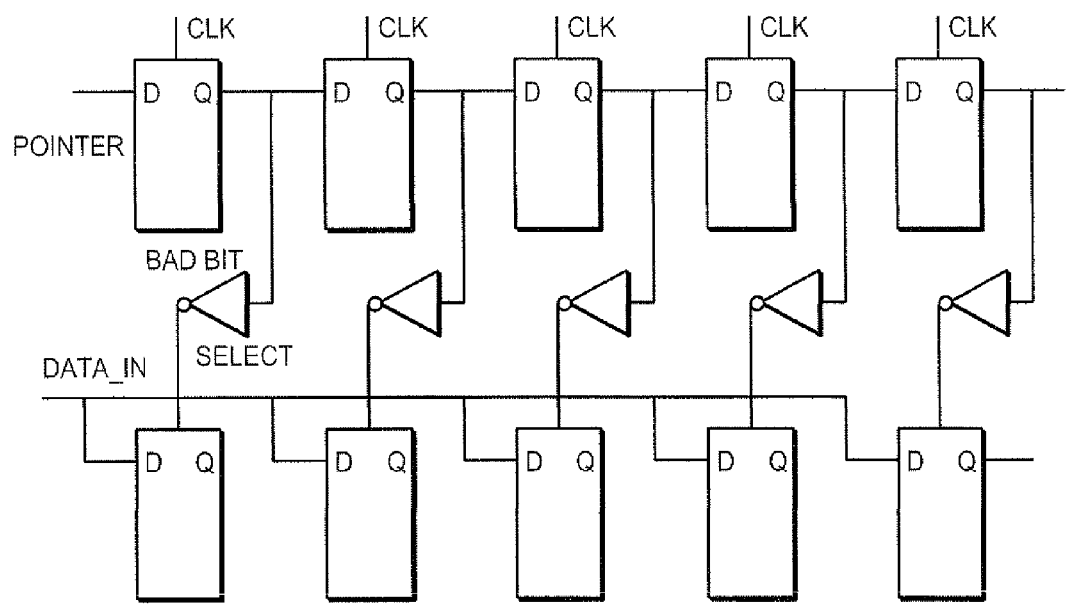
Figure 27:
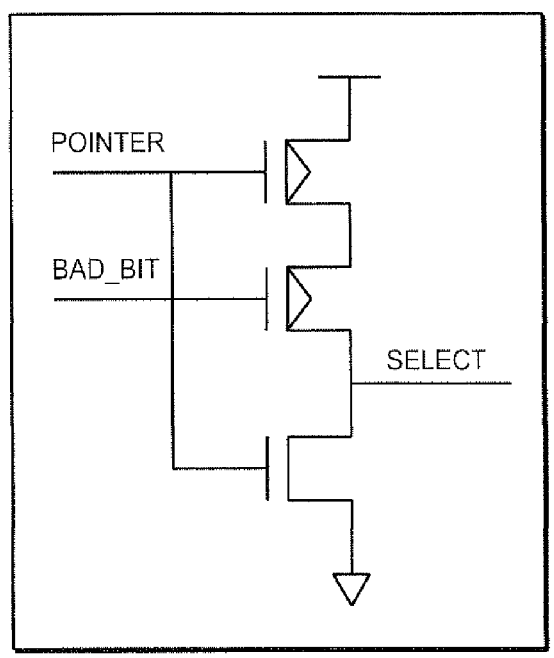
FIGS. 27 and 28 show some exemplary circuitry to implement elements for FIG. 26.
Figures 28, 29:
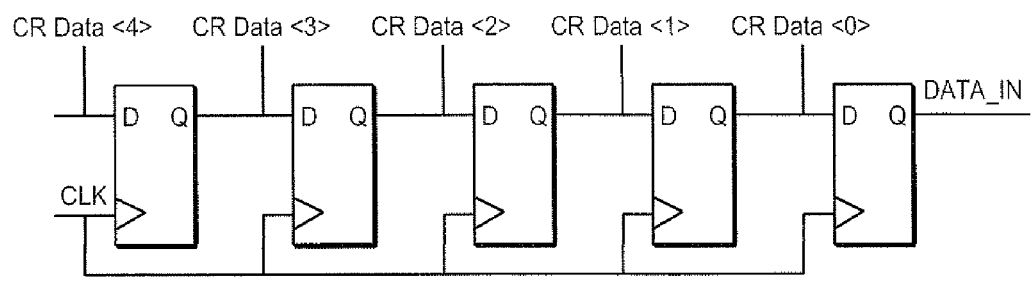
FIG. 29 show how bad bits can be extracted from the column redundancy information.

FIG. 26 shows a pointer based arrangement for column selection that can be used to unpack the data. Across the top is a series of latches allowing the pointer to propagate one clock to toggle through all the latches. The data latches at the bottom receive the packed data at DATA_IN, which is FIFO register with single bit flow out at a time. For the data latches at bottom, only half of the clock signal inputs are used. In the middle is a set of select circuits having as inputs the pointer value and the bad bit information. An exemplary embodiment for the select circuit is shown in FIG. 27. When the pointer is toggled to a given latch and the bad_bit=0, then this address will be selected and the data from the array will be latched into the latch. The pointer will then continue going through all the latches until end of the latches is reached. FIG. 28 shows how the data in the redundant locations can be flowed out of a series of FIFO registers that have as inputs the CRD data as inputs to compact the data. At the end of this process, the data from the redundancy area will be unpacked back to the form.

The on-chip implementation of the bad bit packing and un-packing may use a large number of registers, possibly increasing die size. One to implement the process using a relatively small die area and a limited number of registers is to divide the bad bytes into several groups. Each time, a group of bad columns will be packed or unpacked with fixed number registers to handle address and data information. The algorithm for packing or un-packing can still be the same as described above. For example, if the memory have 40 bad bytes, it can process 10 bytes at a time and finish the bad byte processing in 4 groups. After instance of packing, the packed bytes can be put into the extended column area data latches. After each instance of un-packing, the un-packed bits (or bytes) can be sorted back to their original data place. More details of such an implementation, in a slightly different context, are presented in U.S. patent application Ser. No. 12/414,935.

The techniques described above for the applications of bad column with bad bit information. The bit information will enhanced device yield since more bad columns with bad bits can be repaired with the fixed number column redundancies typically available on a device. Besides the normal operations, it also benefits the bad column management in the devices incorporating an internal folding algorithm, such as that described in U.S. patent application Ser. No. 12/478,997.

The bad bits can be arranged in the column redundancy area as shown in the example of FIG. 29. Three bytes, corresponding to three columns in the main array, with address A, B, and C are shown. The individual bits are identified by the IO values, corresponding to the bit on an IO bus that would transfer these bits for a corresponding set of wordlines. The bad bits in the example are taken as A6, B6, B3 and C0 will be collected to a column ColRD in the redundancy area. As discussed above, the good bits in the bad columns can stay there and get programmed, even though the bad column isolation latch will be set to skip the program completion detections.

The reason to set the bad column isolation latch is that some failures could cause detection fail if the detection is done collectively and simultaneously, but these failure bits should not be counted as they are already repaired by the redundancy. This could lead to overly strict criteria to pass program (or erase) and make the operations return with failed status. For example, if there are 20 bad column repaired by the redundancy columns, these 20 bad columns will cause 40 bits failures. If the program pseudo-pass criteria is set to be 40, then there will be 0 failures allowed for the whole page program. If the program pseudo-pass criteria is set to be less than 40, the page program will always fail. When such situations occur, the status will not reflect the real situation as to whether the write operation has succeeded or not. In order to make sure that the program status reflect the real program situation, the bad columns should be masked out or isolated. If the had bits are counted serially by toggling the data out one byte (or a word) at a time, then the isolation latch is not necessary.

This sort of bit level management can be particularly advantageous for incorporating an internal folding, as that described in U.S. patent application Ser. No. 12/478,997. Briefly, data is initially written to a memory in binary form, folded into a multi-state format in the memory latches, and then rewritten back into the non-volatile memory. To take a 3-bit per cell example, three pages would initially be written onto three physical pages in binary form and then rewritten in 3-bit per cell format onto a single physical wordline. In the case of a bad column, this defect will need to be reflected in the columns with which it is folded, leading to a corresponding increase in number of redundant columns used.

Figure 30:
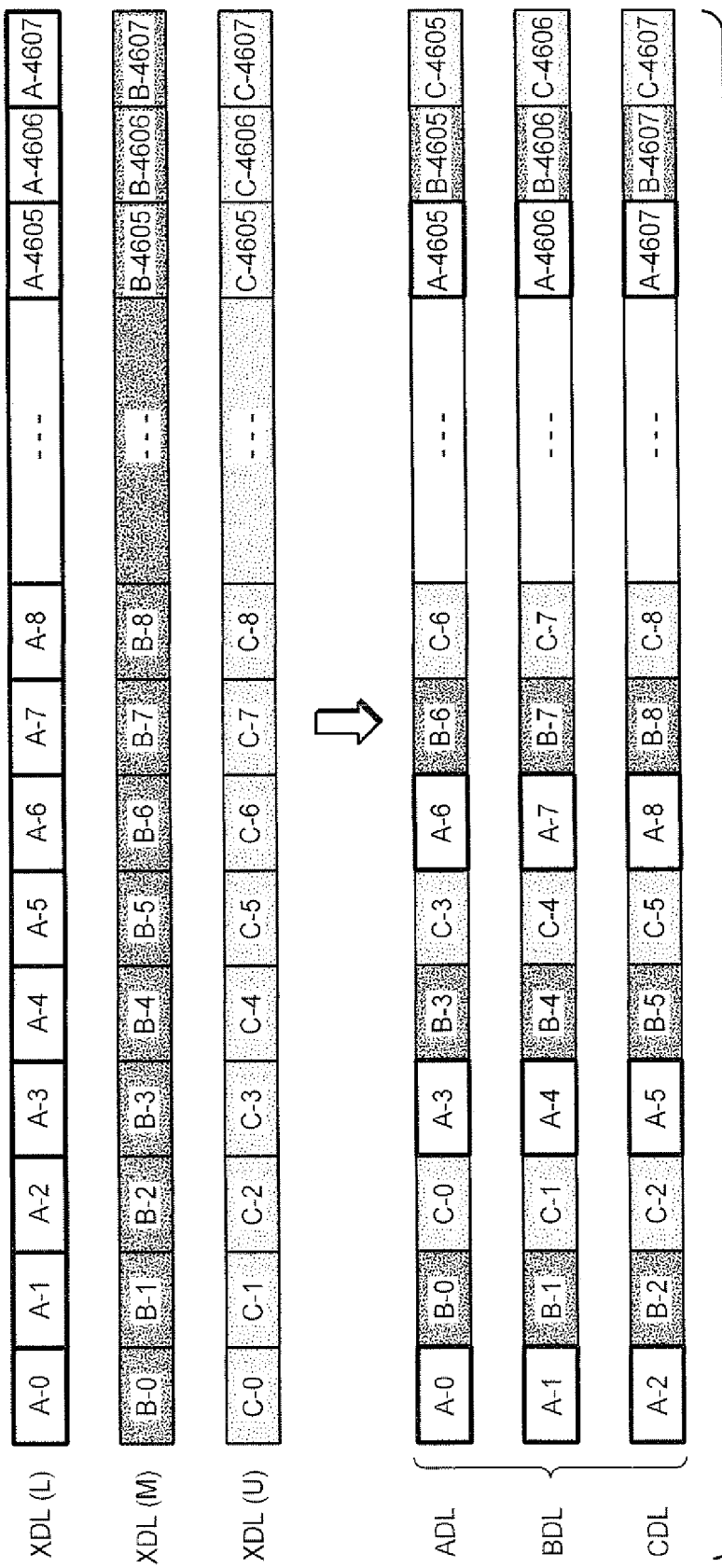
FIG. 30 illustrates an on-chip data folding process.

This process can be illustrated with FIG. 30. In FIG. 30, the XDL latch is the data latch through which an input-output circuit communicates with the data buses and ADL, BDL, and CDL correspond to the data latches for holding each of the bits for a multi-bit (here 3-bit) programming operation. In the folding operation, three separate wordlines with data in a binary format are read in the XDL latches. Here, A, B, C, refer to the wordlines (or physical page) and the numbers (0-4607) to the columns as these bits are stored on three separate, or upper (U), middle (M) and lower (L) wordlines. The bytes are then rearranged from the original 3 pages of data in XDL to into the data latches ADL, BDL and CDL. The content of the ADL, BDL, and CDL latches are then all programmed into a single physical page. (This is again described in more detail in U.S. patent application Ser. No. 12/478,997, although the exemplary folding there differs some.)

Because of this, a bad column will need to be reflected in the other columns with which it is folded. Consequently, in an N-bit per cell folding process, each bad column may be magnified by a factor of N, which could quickly exhaust the available number of redundant columns. Because of this, the use of bit information for bad column can be particularly advantageous in system that use such folding. Even though the folding process will create more failed bits during the process of folding, the bad bits management will reduce the impact of wasting too many redundancy columns because of folding.

Although the various aspects of the present invention have been described with respect to certain embodiments, it is understood that the invention is entitled to protection within the full scope of the appended claims.

What is claimed is:

1. A method of operating a non-volatile memory circuit having an array of non-volatile memory cells formed along columns of multiple bits, the method comprising:
    organizing the columns to include a plurality of regular columns and one or more redundancy columns;
    performing a plurality of first column test operations to determine which columns are defective, each of the first column test operations including:
        writing and reading back an externally supplied data pattern to the columns; and
        comparing the externally supplied data pattern as read back with an expected data pattern,
    wherein said first column test operations are performed by circuitry on the memory circuit and each of the first column test operations uses a different data pattern;
    recording addresses of any of the regular columns determined defective;
    for any of the regular columns determined defective, setting a latch associated therewith to a value indicating that the associated column is defective;
    subsequent to performing the first column test operations, performing a plurality of second column test operations on the regular columns determined defective to determine individual bits therein that are defective, each of the second column test operations including:
        writing and reading back an externally supplied data pattern to the regular columns determined defective; and
        comparing the externally supplied data pattern as read back with an expected data pattern,
    wherein said second column test operations are performed by circuitry on the memory circuit and each of the second column test operations uses a different data pattern; and
    recording addresses of any of the individual bits of the columns determined defective that are determined defective in the column redundancy data table.

2. The method of claim 1, further comprising:
    for any of the redundant columns determined defective, setting corresponding flag values in the column redundancy data table.

3. The method of claim 1, wherein the column test operations are executed by a state machine on the memory circuit.

4. The method of claim 1, wherein the recording addresses of any of the regular columns determined defective and the individual bits therein which are determined defective, includes temporarily storing the results of said comparing on another array of the memory circuit.

5. The method of claim 1, wherein the recording addresses of any of the regular columns determined defective and the individual bits therein which are determined defective, includes storing multiple copies of the column redundancy data table on the memory circuit.

6. The method of claim 1, wherein the column test operations further include:
    determining a failure mode for the regular columns determined defective; and
    recording the failure mode in the column redundancy data table for the regular columns determined defective.

7. The method of claim 6, wherein the failure mode includes an open bitline failure.

8. The method of claim 6, wherein the failure mode includes a bitline short failure.

9. The method of claim 6, wherein the failure mode includes a data latch failure.

* * * * *